United States Patent
Yang

(10) Patent No.: US 12,242,016 B2
(45) Date of Patent: Mar. 4, 2025

(54) NUCLEAR MAGNETIC RESONANCE SENSING DEVICE CALIBRATION SYSTEM AND METHOD

(71) Applicant: Halliburton Energy Services, Inc., Houston, TX (US)

(72) Inventor: Jie Yang, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 8 days.

(21) Appl. No.: 18/223,965

(22) Filed: Jul. 19, 2023

(65) Prior Publication Data

US 2025/0028069 A1    Jan. 23, 2025

(51) Int. Cl.
| | | |
|---|---|---|
| *G01V 3/32* | (2006.01) | |
| *G01R 33/383* | (2006.01) | |
| *G01R 33/389* | (2006.01) | |
| *G01R 33/422* | (2006.01) | |
| *G01R 33/44* | (2006.01) | |
| *G01V 3/38* | (2006.01) | |

(52) U.S. Cl.
CPC ............ *G01V 3/32* (2013.01); *G01R 33/389* (2013.01); *G01R 33/448* (2013.01); *G01V 3/38* (2013.01); *G01R 33/383* (2013.01); *G01R 33/422* (2013.01)

(58) Field of Classification Search
CPC .......... G01V 3/32; G01V 3/38; G01R 33/383; G01R 33/389; G01R 33/422
See application file for complete search history.

(56) References Cited

U.S. PATENT DOCUMENTS

| | | | | |
|---|---|---|---|---|
| 10,254,433 | B2 * | 4/2019 | Yang | G01V 13/00 |
| 10,302,801 | B2 * | 5/2019 | Coman | G01V 3/32 |
| 10,969,513 | B2 * | 4/2021 | Shao | G01N 24/081 |
| 2003/0210050 | A1 | 11/2003 | Prammer et al. | |
| 2015/0212169 | A1 | 7/2015 | Hiller et al. | |
| 2016/0077183 | A1 | 3/2016 | Jachmann et al. | |
| 2020/0355763 | A1 | 11/2020 | Chen et al. | |
| 2022/0381714 | A1 | 12/2022 | Mitchell et al. | |

OTHER PUBLICATIONS

International Search Report & Written Opinion; PCT/US2023/028241; mailed Apr. 17, 2024.

* cited by examiner

*Primary Examiner* — Gregory H Curran
(74) *Attorney, Agent, or Firm* — NOVAK DRUCE CARROLL LLP

(57) ABSTRACT

Described herein are systems and techniques for improving accuracies of determinations made using a nuclear magnetic resonance (NMR) sensing device when the NRM sensing device collects data in a wellbore. NMR sensing devices include a magnet that provides a magnetic field that aligns the spins of protons in substances near the NMR sensing device. The magnetic field strength provided by this magnet affects the sensitivity of the NMR sensing device and affects frequencies that the NMR sensing device effectively uses when the NMR sensing device operates. Furthermore, the field strength of magnets used in an NMR sensing device varies with temperature. Since temperatures within a wellbore vary significantly and since these temperatures affect how an NMR sensing device operates, systems and techniques of the present disclosure collect calibration data in a calibration chamber such that data sensed by the NMR sensing device can be interpreted more accurately when temperatures change.

20 Claims, 15 Drawing Sheets

NUCLEAR MAGNETIC RESONANCE SENSING DEVICE CALIBRATION SYSTEM AND METHOD

TECHNICAL FIELD

The present disclosure is generally directed to improving the accuracy of tools deployed in a wellbore. More specifically, the present disclosure improves the accuracy of determinations regarding a wellbore and/or associated tools made by collecting and applying performance data of a nuclear magnetic resonance sensing device.

BACKGROUND

When managing oil and gas drilling and production environments (e.g., wellbores, etc.) and performing operations in such production environments, sensor data is often collected and evaluated to make determinations on how to manage a wellbore. Such sensor data may be used to understand downhole conditions and materials that are located in a wellbore. For example, sensor data can be used to identify features associated with Earth formations. Evaluations performed on such sensed data may be used to identify locations where hydrocarbons may be extracted from those Earth formations. Conditions associated with a wellbore operation can create significant challenges in interpreting data collected by sensors.

BRIEF DESCRIPTION OF THE DRAWINGS

In order to describe the manner in which the features and advantages of this disclosure can be obtained, a more particular description is provided with reference to specific implementations thereof which are illustrated in the appended drawings. Understanding that these drawings depict only exemplary implementations of the disclosure and are not therefore to be considered to be limiting of its scope, the principles herein are described and explained with additional specificity and detail through the use of the accompanying drawings in which.

DETAILED DESCRIPTION

Figure 1A:
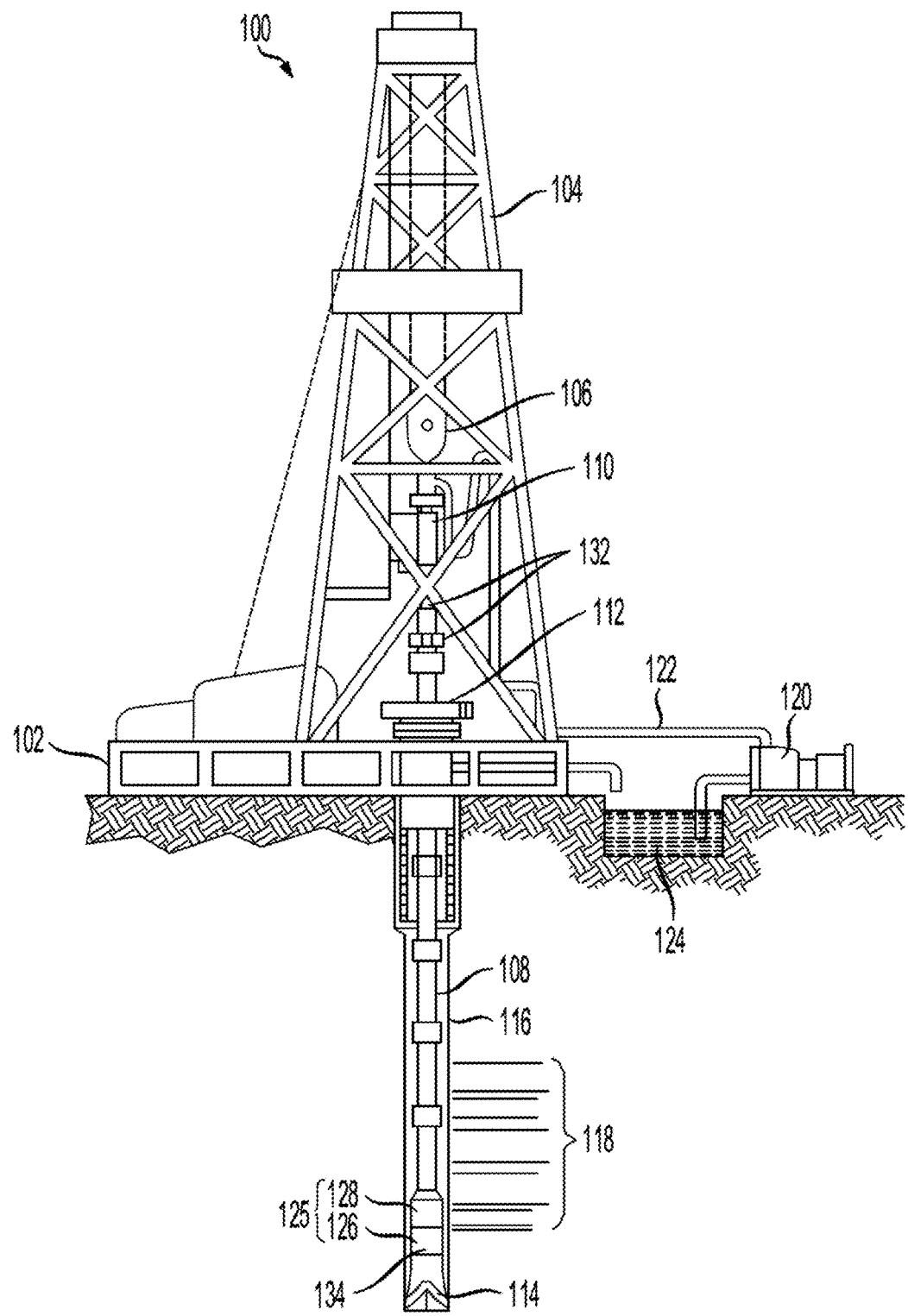
FIG. 1A is a schematic diagram of an example logging while drilling wellbore operating environment, in accordance with various aspects of the subject technology.

Various aspects of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the principles disclosed herein. The features and advantages of the disclosure can be realized and obtained by means of the instruments and combinations particularly pointed out in the appended claims. These and other features of the disclosure will become more fully apparent from the following description and appended claims or can be learned by the practice of the principles set forth herein.

It will be appreciated that for simplicity and clarity of illustration, where appropriate, reference numerals have been repeated among the different figures to indicate corresponding or analogous compounds. In addition, numerous specific details are set forth in order to provide a thorough understanding of the methods and apparatus described herein. However, it will be understood by those of ordinary skill in the art that the methods and apparatus described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the present disclosure.

Described herein are systems, apparatuses, processes (also referred to as methods), and computer-readable media (collectively referred to as "systems and techniques") for improving an accuracy of determinations made using data sensed in a wellbore. Nuclear magnetic resonance (NMR) sensing devices may be used to collect data in a wellbore. NMR sensing devices include a magnet (e.g., a permanent magnet or electromagnet) that provides a magnetic field that aligns the spins of protons in substances near the NMR sensing device. The magnetic field strength provided by the magnet of the NMR sensing device affects the sensitivity of the NMR sensing device and affects frequencies that the NMR sensing device effectively uses when the NMR sensing device operates. Furthermore, the field strength of magnets used in an NMR sensing device varies with temperature. Since temperatures within a wellbore vary significantly and these temperatures affect how an NMR sensing device operates, the systems and techniques of the present disclosure can collect calibration data such that data sensed by the NMR sensing device can be interpreted more accurately even when temperatures of the NMR sensing device change.

The greater the magnetic field strength of the NMR sensing device, the greater the sensitivity of the NMR sensing device. In operation, an NMR sensing device applies a magnetic field that aligns the spins protons included in a sample (e.g., a substance(s), a material, a structure, a rock formation, a mixture, mud, fluid, a tool and/or device, an object, an element, matter, a wellbore system and/or component, etc.) that are near the NMR sensing device. Once the protons in the nearby (e.g., within a threshold proximity to the NMR sensing device) sample are aligned, the NMR sensing device emits (transmits) a set of radio frequency (RF) signals that disrupt these aligned protons. This disruption of these spins may be sensed by a sensor (e.g., a coil or antenna) at the NMR sensing device. When the energy emitted by the disrupted protons passes by the sensor, the sensor generates one or more signals that have characteristics that can be evaluated to identify what materials are included in the sample near the NMR sensing device.

The strength of a magnetic field generated by a magnet (e.g., a permanent magnet or electromagnet) of an NMR sensing device can vary with temperature. This may mean that as a temperature changes from a first temperature (e.g., 25 degrees Celsius) to a second temperature (e.g., 150 degrees Celsius), the strength of the magnetic field generated by the magnet reduces. This reduction in the magnetic field strength with temperature may be attributed to reduced alignments of magnetic moments of molecules or electrons included in the magnet. This is one reason why values of responses measured by an NMR sensing device can change with temperature even when an amount of energy or power associated with a stimulus used to generate the responses is the same.

Environmental conditions in a wellbore can vary significantly. For example, temperatures in a wellbore can vary from a temperature close to an ambient temperature of a location on the Earth's surface where the wellbore is located (e.g., a surface or opening of the wellbore) to temperatures that exceed 150 degrees Celsius (C). Advantageously, the systems and techniques described herein can make repeatable determinations from data collected by an NMR sensing device even when measurement values vary with an environmental condition, such as temperature. To account for temperature related effects, operation of an NMR sensing device may be calibrated by collecting data at temperatures commensurate with those found in a wellbore.

After an NMR sensing device is calibrated, it may be deployed when a wellbore is being drilled, after the wellbore has been drilled, or both. The NMR sensing device can be placed at one or more locations within the wellbore. Evaluations performed during such operations may identify types of strata included in subterranean formations. Alternatively or additionally, these evaluations may be used to identify locations where substances may be extracted from (e.g., oil, natural gas, or water) a formation and/or where substances may be injected into a formation (e.g., during a hydraulic fracturing or carbon sequestration process). These evaluations may be used to identify locations within a wellbore where a threshold level of hydrocarbons may be extracted, as well as other information about the wellbore, the wellbore operations, etc.

Examples of the systems and techniques described herein are illustrated in FIG. 1A through FIG. 8 and described below.

FIG. 1A is a schematic diagram of an example logging while drilling wellbore operating environment, in accordance with various aspects of the subject technology. The drilling arrangement shown in FIG. 1A provides an example of a logging-while-drilling (commonly abbreviated as LWD) configuration in a wellbore drilling scenario 100. The LWD configuration can incorporate sensors (e.g., EM sensors, seismic sensors, gravity sensor, image sensors, etc.) that can acquire formation data, such as characteristics of the formation, components of the formation, etc. For example, the drilling arrangement shown in FIG. 1A can be used to gather formation data through an electromagnetic imager tool (not shown) as part of logging the wellbore using the electromagnetic imager tool. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids.

Logging tools 126 can be integrated into the bottom-hole assembly 125 near the drill bit 114. As drill bit 114 extends into the wellbore 116 through the formations 118 and as the drill string 108 is pulled out of the wellbore 116, logging tools 126 collect measurements relating to various formation properties as well as the orientation of the tool and various other drilling conditions. The logging tool 126 can be applicable tools for collecting measurements in a drilling scenario, such as the electromagnetic imager tools described herein. Each of the logging tools 126 may include one or more tool components spaced apart from each other and communicatively coupled by one or more wires and/or other communication arrangement. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure.

The bottom-hole assembly 125 may also include a telemetry sub 128 to transfer measurement data to a surface receiver 132 and to receive commands from the surface. In at least some cases, the telemetry sub 128 communicates with a surface receiver 132 by wireless signal transmission (e.g., using mud pulse telemetry, EM telemetry, or acoustic telemetry). In other cases, one or more of the logging tools 126 may communicate with a surface receiver 132 by a wire, such as wired drill pipe. In some instances, the telemetry sub 128 does not communicate with the surface, but rather stores logging data for later retrieval at the surface when the logging assembly is recovered. In at least some cases, one or more of the logging tools 126 may receive electrical power from a wire that extends to the surface, including wires extending through a wired drill pipe. In other cases, power is provided from one or more batteries or via power generated downhole.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. Because of the thickness of the collar's wall, pocket-type cutouts or other type recesses can be provided into the collar's wall without negatively impacting the integrity (strength, rigidity and the like) of the collar as a component of the drill string 108.

Figure 1B:
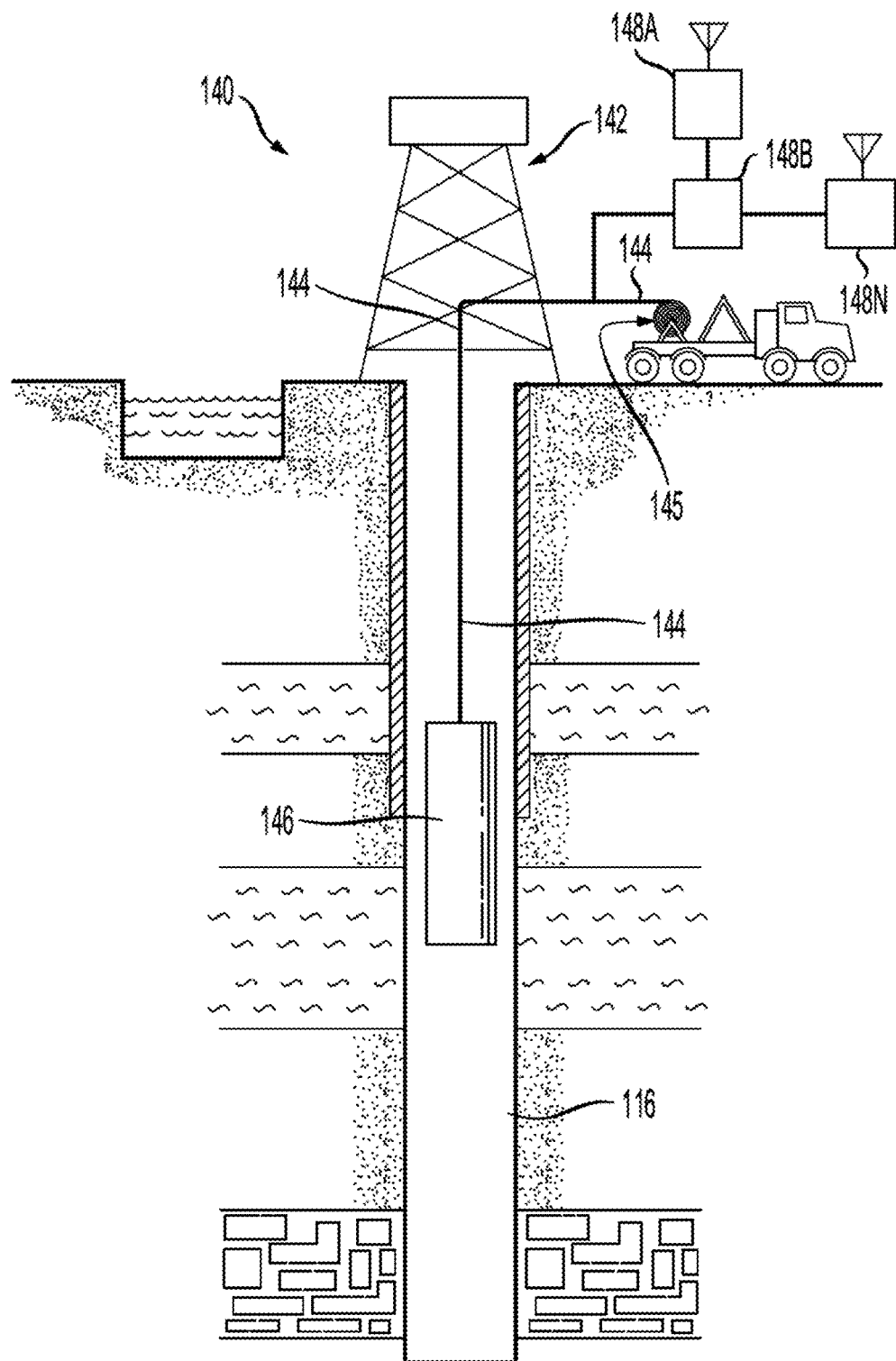
FIG. 1B is a schematic diagram of an example downhole environment having tubulars, in accordance with various aspects of the subject technology.

FIG. 1B is a schematic diagram of an example downhole environment having tubulars, in accordance with various aspects of the subject technology. In this example, an example system 140 is depicted for conducting downhole measurements after at least a portion of a wellbore has been drilled and the drill string removed from the well. An electromagnetic imager tool (not shown) can be operated in the example system 140 shown in FIG. 1B to log the wellbore. A downhole tool is shown having a tool body 146 in order to carry out logging and/or other operations. For example, instead of using the drill string 108 of FIG. 1A to lower the downhole tool, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars. The downhole tool can include an applicable tool for collecting measurements in a drilling scenario, such as the electromagnetic imager tools described herein.

The illustrated wireline conveyance 144 provides power and support for the tool, as well as enabling communication between data processors 148A-N on the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. The processors 148A-N can be integrated as part of an applicable computing system, such as the computing device architectures described herein. Moreover, power can be supplied via the wireline conveyance 144 to meet power requirements of the tool. For slickline or coiled tubing configurations, power can be supplied downhole with a battery or via a downhole generator.

As mentioned above, one type of equipment that may be used to collect data in a wellbore is a nuclear magnetic resonance (NMR) sensing device. When an NMR sensing device is deployed in a wellbore, a magnetic field provided by a magnet of the NMR sensing device aligns at least some of the protons (e.g., protons of hydrogen atoms) in materials that are near the NMR sensing device. The spins of protons affected by the magnetic field may align in one of two directions, a first direction, the $-\frac{1}{2}$ spin state, that is associated with a first energy state and in a second direction, the $+\frac{1}{2}$ spin state, that is associated with a second energy state.

Figure 2:
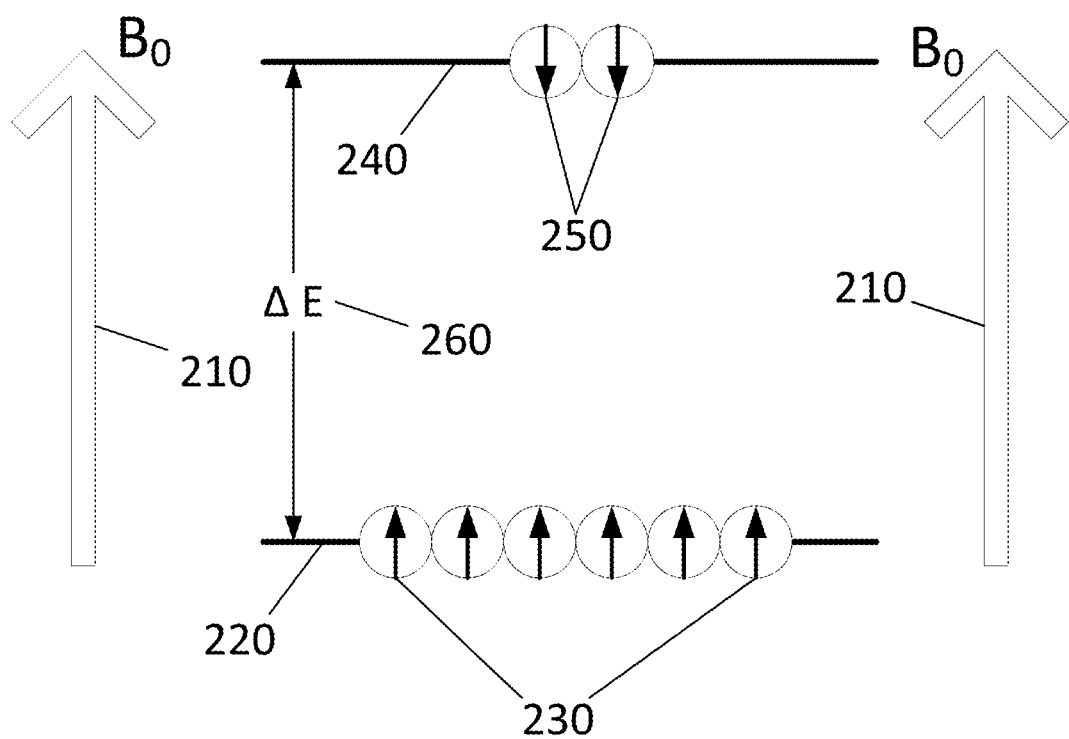
FIG. 2 shows how the directions of spins of protons included in a sample align when exposed to an external magnetic field, in accordance with various aspects of the subject technology.

FIG. 2 shows how the directions of spins of protons included in a sample align when exposed to an external magnetic field. FIG. 2 includes magnetic field 210 that has a field strength $B_0$. When magnetic field 210 is applied to the sample and given sufficient time, affected protons in hydrogen atoms of the sample will align with the magnetic field 210 in either the $-\frac{1}{2}$ spin state or the $+\frac{1}{2}$ spin state. Protons 230 are illustrated as circles with arrows pointing in an upwards direction, these upward arrows indicate that protons 230 are in the $+\frac{1}{2}$ spin state. Protons 250 are illustrated as circles with arrows pointing in a downward direction, these downward arrows indicate that protons 250 are in the $-\frac{1}{2}$ spin state. Lines 220 and 240 are energy states respectively associated with spins of protons 230 and 250. A value of energy $\Delta E$ (260) that separates the higher energy $-\frac{1}{2}$ spin state from the lower energy $+\frac{1}{2}$ spin state will increase with a value of applied magnetic field $B_0$. Note that there are more protons at the lower energy $+\frac{1}{2}$ spin state (e.g., protons 230) than protons that are at the higher energy $-\frac{1}{2}$ spin state (e.g., protons 250). The number of protons 230 at the lower energy state and the number of protons 250 at the higher energy state may correspond to a Boltzmann distribution, where the state distributions of protons at different energy states may vary as a function of temperature. Before a magnetic field is applied to a sample, the spins of protons included in that sample may be randomly distributed and the sample may have a net magnetic field of zero. As mentioned above, when a sample is placed in a magnetic field, at least some protons within the sample will align with the magnetic field. The amount of time it takes for the spins of protons to settle into alignment with the magnetic field (T1 time) may vary based on specific compounds that are included in the sample. Some non-limiting, illustrative examples of alignment times include three seconds and five seconds.

Figure 3:
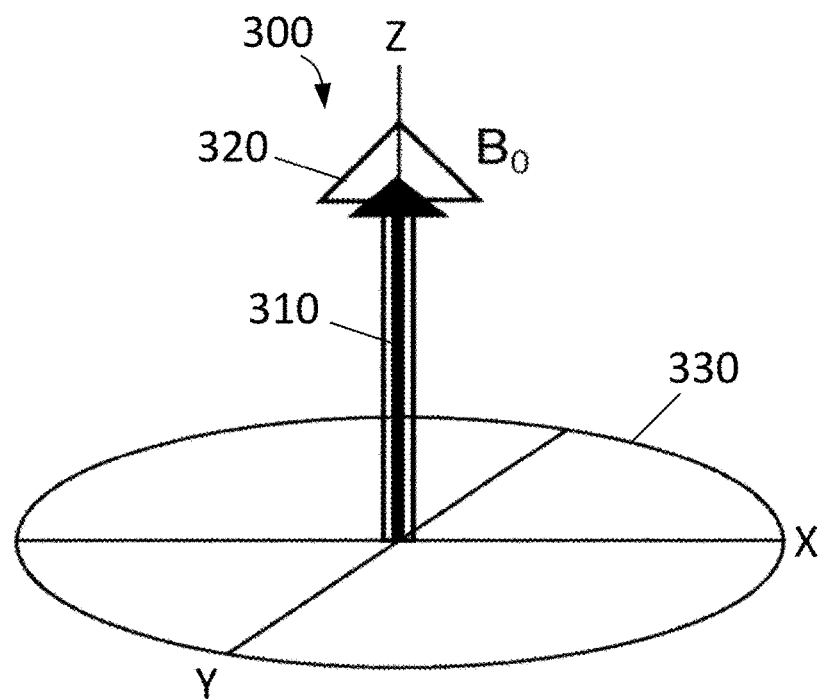
FIG. 3 includes a first image where a magnetic field aligns spins of protons in a sample and includes a second image where the spins of the protons in the magnetic field are disrupted by a radio frequency signal, in accordance with various aspects of the subject technology.
Figure 3:
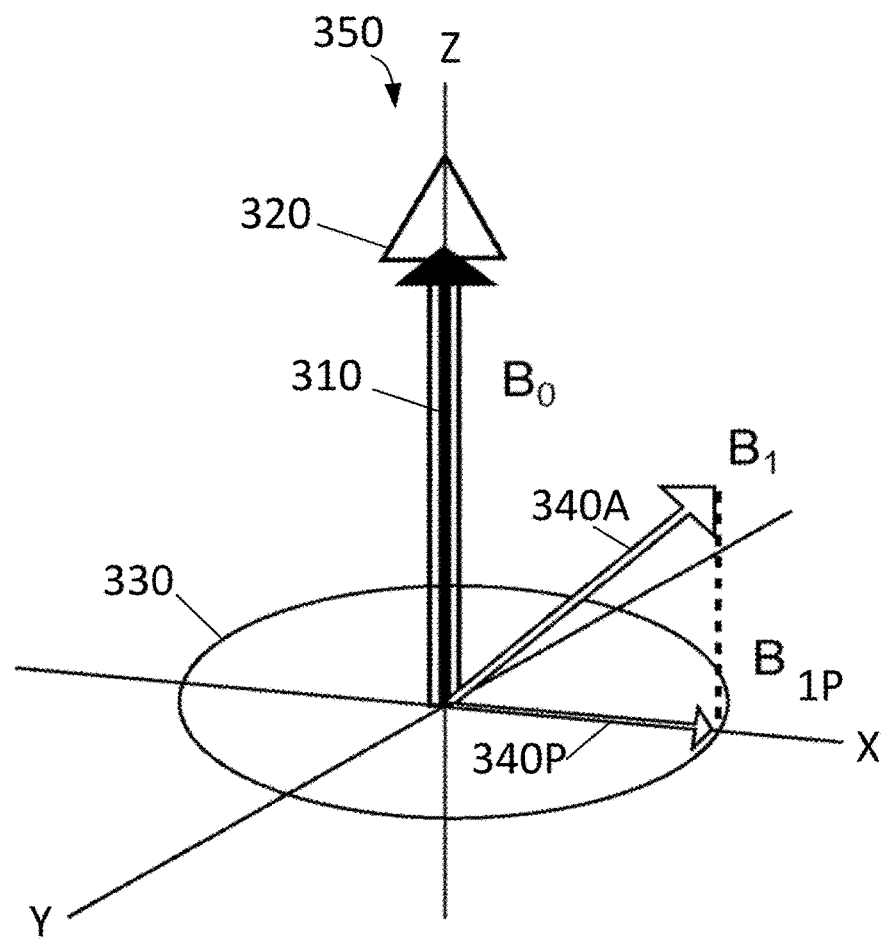

FIG. 3 includes two different images, a first image where proton spins of a sample are aligned with an applied magnetic field and a second image where proton spins of the sample are disrupted by radio frequency signals transmitted by an NMR device. FIG. 3 includes image 300 where applied magnetic field 310 of field strength $B_0$ is used to align the spins of protons in a sample parallel to the Z axis of image 300. A magnitude of vector 320 in image 300 may correspond to net (total parallel magnetic moment (of protons 230 of FIG. 2) and total anti-parallel magnetic moment (of protons 250 of FIG. 2) magnetic moments of proton spins that are parallel to applied magnetic field 310. Image 300 also includes an X axis and a Y axis that form plane 330.

After the spins of protons included in the sample are aligned with applied magnetic field 310, RF signals may be emitted by the NMR sensing device. Magnetic fields associated with these RF signals may disrupt the spins of the protons in a sample. A greater amount of energy of an RF pulse will result in a greater disruption of the proton spins. An amount of disruption in these spins may vary with a duration of the RF signal or with RF signal amplitude. Image 350 illustrates an instance where the net magnetic moment of spin is rotated with an offset angle from this Z axis as indicated by vector 340A. An angle associated with a change in spin direction may be referred to as a tipping angle. Antennas at the NMR sensing device sense changes in the spins of protons by measuring changes in electromagnetic fields along plane 330 may be referred to as RF field B1, 340P is the corresponding component perpendicular to B0, which is responsible for tipping proton spins.

RF signals with different energies may be used to disrupt the spins of protons by different amounts. The transmission of a first RF signal toward a sample may result in the angles of proton spins in the sample being changed by 90 degrees. As such, this first RF signal may be classified as a 90 degree RF signal pulse (or excitation pulse) that induces a 90 degree tipping angle. Similarly, the transmission of a second RF signal toward the sample may result in the angles of proton spins in the sample being changed by 180 degrees. Because of this, the second RF signal may be classified as a 180 degree RF signal pulse (or refocus pulse) that induces a 180 degree tipping angle. Since the tipping angle varies with RF signal energy, the 90 degree RF pulse may be twice as long or have twice the amplitude of the 180 degree pulse when tipping angle varies linearly with applied RF signal energy. NMR sensing devices may use other types of RF signal pulses. For example, a type of signal pulse that depolarizes (or randomizes) protons spins may be referred to as a chirp.

Operation of an NMR sensing device may include aligning protons in an applied magnetic field for a period of time, transmitting one or more RF signal pulses, and making one or more measurements by the NMR sensing device. This process may be repeated using different lengths of time period. Evaluations may then be performed to identify materials that are present in the sample based on known correspondences between the transmitted RF signal pulses and the measurements made by the NMR sensing device.

Permanent magnets can be used as a source of the applied magnetic field that an NMR device uses. The strength of a magnetic field of a permanent magnet varies with temperature. As temperature increases, the magnetic field strength of a particular permanent magnet will tend to reduce. Since environmental temperatures of a wellbore vary, the magnetic field strength of a magnet used in an NMR sensing device deployed in a wellbore will vary with the wellbore temperature.

Another factor that changes with magnetic field strength is the resonate frequency of protons included within a sample. Since the magnetic field for a particular magnet varies with temperature, resonant frequencies associated with a particular NMR magnetic arrangement will change as temperatures change in a wellbore. This means that a change in temperature may affect operation of an NMR sensing device. The resonant frequency may also vary with distance that separates an NMR sensing device from substances. Because of this RF signal frequencies used to disrupt the spins of hydrogen protons may be varied to collect data associated with the substances that are located at these different distances.

Since the spins protons of hydrogen atoms are affected by the applied magnetic field and energy from RF signals, certain compounds, such as compounds that include hydrogen will be sensitive to these applied magnetic fields ($B_0$) and applied RF signal energy ($B_1$). Different chemical compounds that include hydrogen are affected differently by such applied magnetic fields and RF energy. Furthermore, arrangements of hydrogen atoms in a sample may affect operation of an NMR sensing device. Because of this, NMR devices may be used to identify compounds that are located at specific wellbore locations and may identify characteristics of subterranean formations, such as pore size, porosity, and permeability from collected data. Conditions that occur in a wellbore may include temperatures and pressures that are significantly different than conditions at the surface of the Earth. For example, a temperature inside a wellbore may be 150 degrees Celsius (C) when a surface temperature is 25° C.

Because of the various temperature related effects that affect operation of an NMR sensing device and since NMR sensing devices are used in wellbores where temperature varies, an NMR sensing device should be calibrated before being used to collect wellbore data. As such, methods of the present disclosure provide a way to more accurately calibrate NMR sensing devices.

Figure 4:
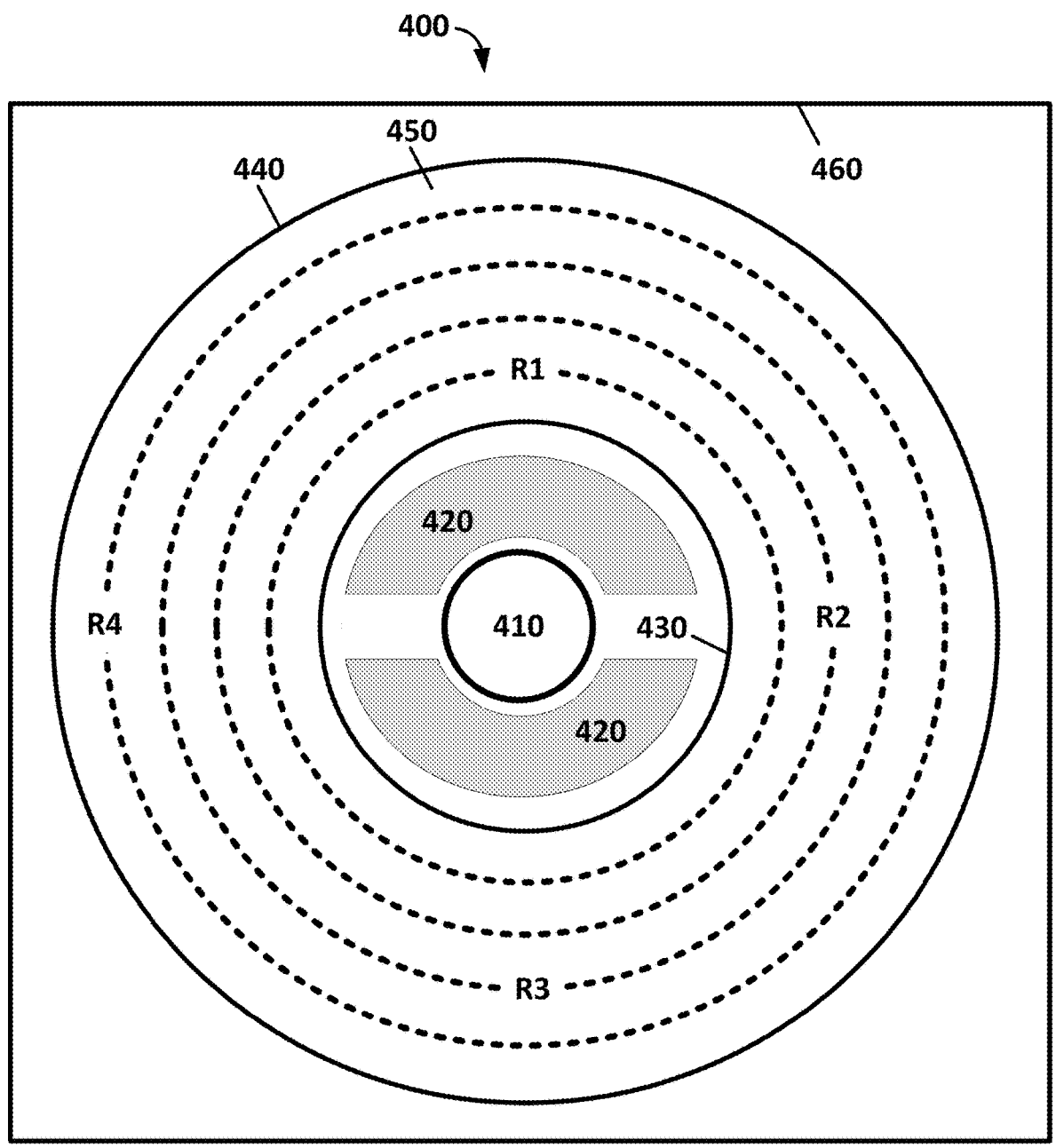
FIG. 4 illustrates a nuclear magnetic resonance sensing device placed in a calibration chamber, in accordance with various aspects of the subject technology.

FIG. 4 illustrates a nuclear magnetic resonance (NMR) sensing device placed in a calibration chamber. The NMR sensing device configuration 400 of FIG. 4 includes NMR sensing device 430, containment vessel 440, and chamber 460. The NMR sensing device 430 includes NMR magnet 410 and transmission/reception antennas 420. Containment vessel 440 includes inside area 450 that may be filled with a fluid/liquid such as oil. Such a fluid/liquid may be referred to as a calibration medium. Chamber 460 may be made of non-magnetic metal and once chamber 460 is sealed, it may act as a Faraday shield that blocks electromagnetic energy from influencing tests that are performed by NMR sensing device 430. Chamber 460 may include a heater that heats the chamber to temperatures that may be found in a wellbore. Additionally, chamber 460 may be configured to control pressure. In such an instance, a gas (possibly an inert gas like nitrogen) could be added to the chamber to pressurize the chamber to pressures that may be found in the wellbore. While the calibration medium is described as being a fluid/liquid that may be water or oil, in certain instances other mediums may be used. For example, the calibration medium could be or could include rock samples.

The dashed circular lines R1, R2, R3, and R4 represent different radii from a central axis of magnet 410. Since NMR resonant frequency vary with magnetic field strength and since magnetic field strength varies with distance, a process for calibrating NMR sensing device 430 may collect data based on measurements associated with each of a plurality of different radii (e.g., R1, R2, R3, and R4). When containment vessel 440 is filled with a fluid (e.g., water or oil), protons in hydrogen atoms in the fluid may be exposed to magnetic fields and pulses of transmitted RF energy when NMR device 430 operates. Some the materials included in calibration chamber 460 may be controlled by engineers or scientists (operators) that operate NMR device 430, these operators may select a fluid with characteristics suitable for measuring proton spins. This fluid may have a known chemical composition such that data collected by NMR device 430 may be evaluated more based on the known chemical composition of the fluid. Oil may be used instead of water to prevent the water from boiling and evaporating when NMR device 430 is calibrated. This oil may have a known chemical composition such that data collected by NMR device 430 may be evaluated more based on the known chemical composition of the oil.

Figure 5:
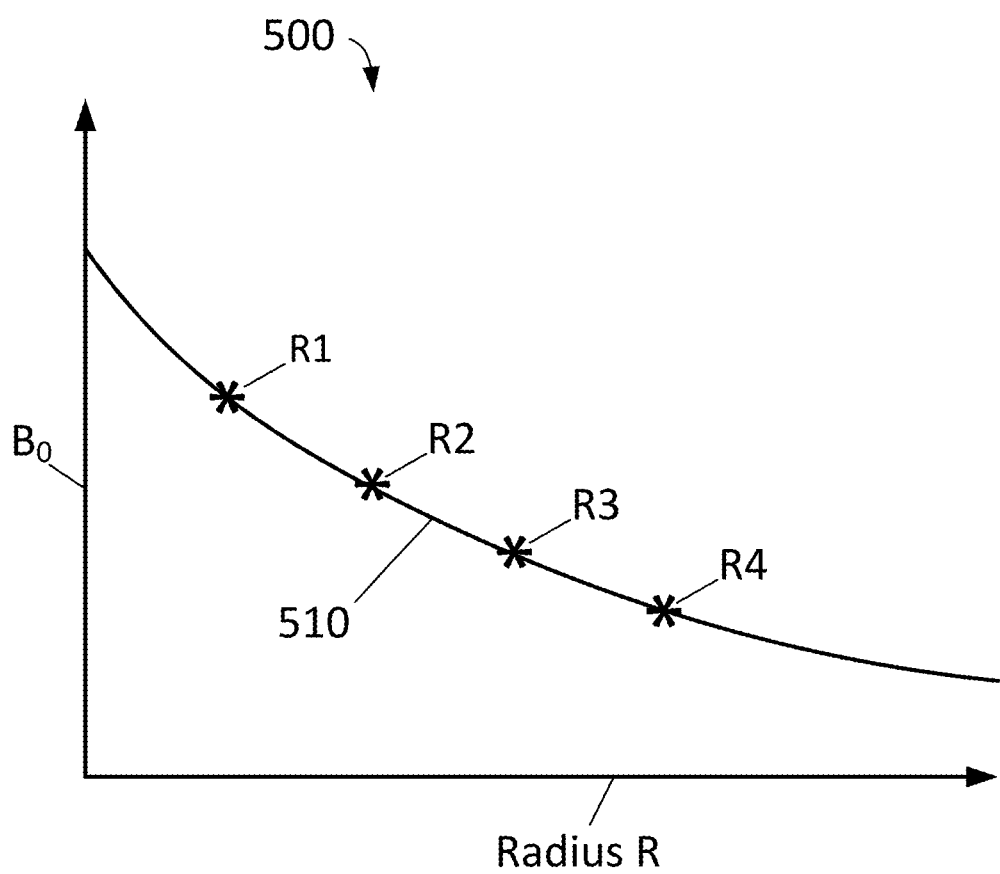
FIG. 5 includes a graphical representation that shows how a magnetic field of a magnetic may vary with a radial distance from a center point of the magnet, in accordance with various aspects of the subject technology.

FIG. 5 includes a graphical representation that shows how a magnetic field of a magnetic may vary with a radial distance from a center point of the magnet. Graph 500 of FIG. 5 includes vertical axis of magnetic field $B_0$ and horizontal axis of radius R. Curve 510 of graph 500 shows that the strength of the magnetic field $B_0$ reducing from radius as radius distance is increased. In certain instances, a Gauss meter may be used to measure the magnetic field $B_0$ at each of a set of radii (e.g., R1, R2, R3, and R4). The asterisks labeled R1, R2, R3, and R4 are points that show measured magnetic field $B_0$ strength with each radius R1, R2, R3, and R4. Curve 510 may be generated by a curve fitting process. Generally, this magnetic field may vary according to the inverse square law. Units of the measured magnetic field may be expressed in Tesla or Gauss units of magnetic flux density.

The measurements of the magnetic field at the different radii may be performed as part of a calibration procedure. Since Gauss meters may be damaged when exposed to temperatures that are common in a wellbore (e.g., temperatures up to or exceeding 150 degrees Celsius), such a calibration procedure may not use Gauss meters at such temperatures. As such, a calibration procedure may initially use a Gauss meter to measure a magnetic field of the magnet at different radii (e.g., R1, R2, R3, and R4). This may occur at an ambient temperature (e.g., 25 degrees C.) or at controlled temperatures known not to damage or otherwise affect the operation of Gauss meters. Such measurements of magnetic field $B_0$ may act as a baseline for other evaluations performed during a calibration procedure. Since the magnetic field used to measure NMR effects is provided or "applied" by a magnet of an NMR device, magnetic field $B_0$ may be referred to as an applied magnetic field.

An NMR sensing device may then be used to collect data at different temperatures. In instances when a Gauss meter is used, some of these temperatures may be the same temperatures at which the magnetic field of the NMR device was measured using the Gauss meter. For example, when a Gauss meter is used to collect data at 25 degrees C., data may be collected at this temperatures using the NMR sensing device.

Another factor that affects operation of an NMR device is that a strength (value, magnitude, or measure) of magnetic field $B_0$ affects the resonant frequency of protons that are influenced by that value of magnetic field $B_0$. To stimulate disruptions in proton spins, the frequency of an applied RF signal pulse must match the resonate frequency of the proton spins at the value of magnetic field $B_0$. Since the value of an applied magnetic field also varies with distance, different frequencies of RF signal pulses must be used to measure responses to RF pulses being transmitted into substances near an NMR sensing device.

A resonant frequency at a particular value of magnetic field strength may be calculated using the formula $f=\gamma*B_0$, where $\gamma$ is a constant: 42.58 Mhz/Tesla. When values of $B_0$ in Tesla are used, the product of $\gamma*B_0$ will be in values of frequency in Mhz. This means that responses at different radii from the magnet of the NMR device will be sensitive to different frequencies of transmitted RF signal pulses. As such, by knowing how the strength of an applied magnetic field varies with distance allows a stimulus frequency to be identified using the formula above.

Figure 6:
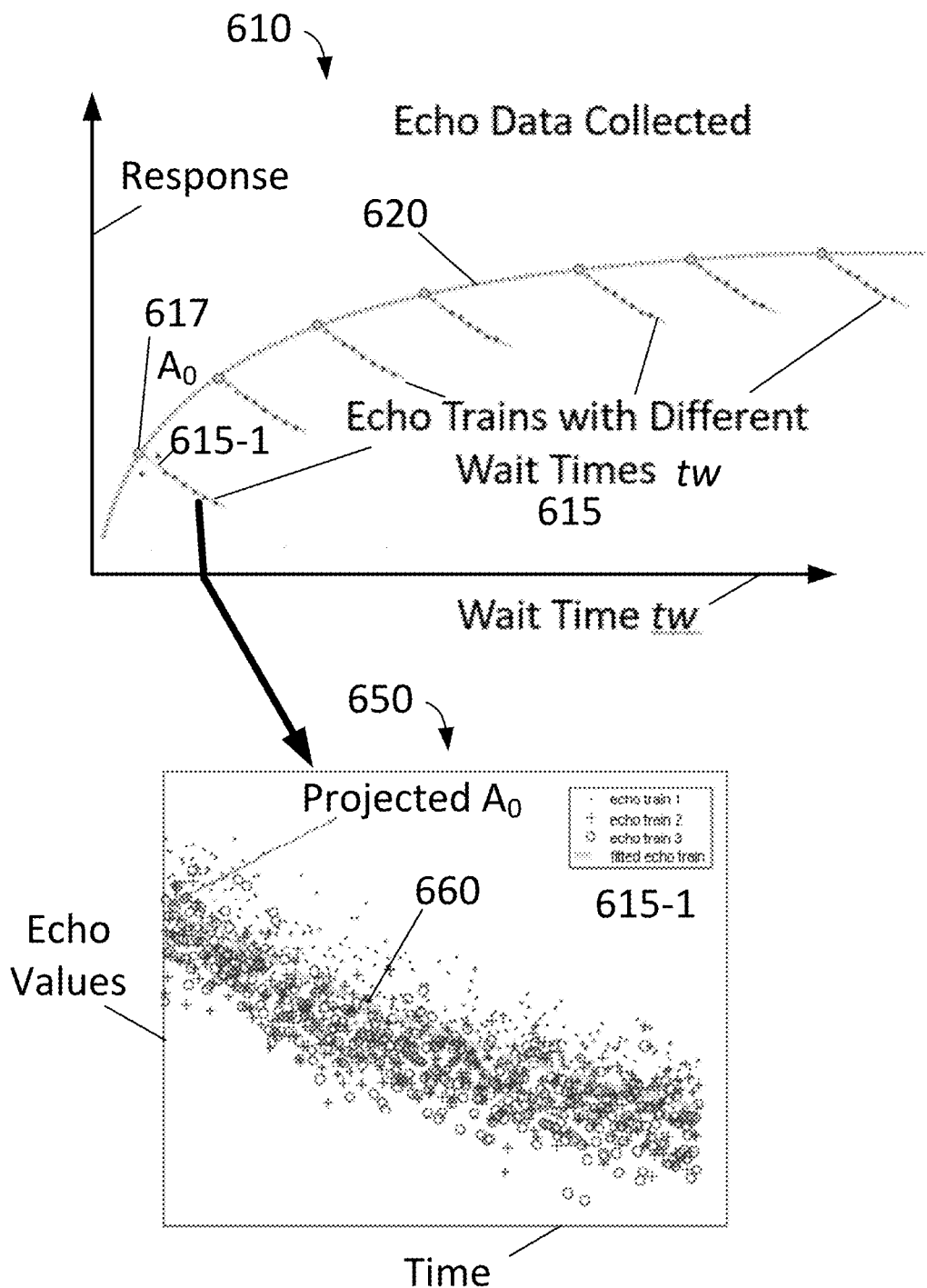
FIG. 6 illustrates a graph that may be generated from collected data such that noise may be reduced in the collected data, in accordance with various aspects of the subject technology.

FIG. 6 illustrates a graph that may be generated from collected data such that noise may be reduced in the collected data. FIG. 6 includes graph 610 that shows several different sets of collected echo train data 615 that may be used to generate T1 time (build-up) curve 620. When an NMR sensing device is deployed in a wellbore, a magnet of the NMR sensing device may be used to align the spins of protons in substances that are near the NMR sensing device magnet. As mentioned above, this may include exposing these substances to a magnetic field for a time referred to as the T1 buildup or alignment time. After the spins of these protons are allowed to align over the T1 buildup time, a burst or series of bursts of RF energy may be transmitted into the wellbore substances and responses to that transmitted RF energy may be measured by the NMR sensing device. The T1 buildup curve 620 may be a measure of build-up rate or alignment of protons in the Z direction after proton spins have been depolarized (randomized). T2 times may be a measure of the decay rate measured along the X-Y plane as indicated by echo trains 615.

Either a single RF pulse or a series of RF pulses with specific timing between them may be transmitted and the NMR device may then collect NMR data after the proton spins have been disrupted. The NMR signal observed after a pulse may be referred to the FID (free induction decay) signal. By using such pulses, an NMR sensing device may be used to measure chemical shift spectra which resolves the hyperfine interactions between different spin types. In a wellbore, a magnetic field will tend to have a natural gradient, and the NMR sensing device may be used to measure relaxation times of polarization (where proton spins move to align into equilibrium with the applied magnetic field) such that the T1 buildup curve 620 of FIG. 6 may be drawn. This may include measuring decay time (the fall off of measured signal over time) T2.

A basic sequence to measure T2 time may be to transmit an excitation pulse (90 degree pulse) followed by a series of refocusing pulses (180 degree pulse, for example). The timing between the refocusing pulses can be varied, yet for most sequences it may be kept the same such that echo data may be collected. An echo may be described as the deconvoluted and integrated signal between a set of refocusing pulses. Echo data may be recorded most often as the simplest form of the NMR data acquired downhole. For T1 measurement, the sequence may start with an inversion or a saturation pulse (depolarization pulse) followed by a wait time. After the wait time a T2 pulse transmission sequence may be run. The process may then repeated for several different wait times allowing for different polarizations of magnetization to be measured.

Transmitted signals and responses may be measured using one or more antennas. A single antenna may be used to excite the spins of hydrogen protons and one or more antennas may be used to receive the responses. In certain instances, two orthogonal antennas may be used to excite proton spins when excitation referred to as circular polarization.

Once the spins of protons included in the materials that surround an NMR sensing device have been aligned along a Z axis, an RF signal burst may be provided to disrupt these spins. The NMR sensing device may then measure the amount of this disruption along a plane of the X-Y axes. Since the amount of disruption may vary with an amount of energy included in the RF signal pulse, the NMR sensing device may be configured to vary how much energy that is transmitted when evaluations are performed. The NMR sensing device may be configured to provide amounts of energy that corresponds to angles of proton spin disruption. The energy included in a first RF signal pulse may correspond to the amplitude of that first RF signal pulse and/or a number of periods included in that first RF signal pulse. In a T2 sequence, this first RF signal pulse may be associated with a 90 degree angular disruption of the proton spins and a second RF signal pulse may be associated with a 180 degree angular disruption of the proton spins. The second RF signal pulse may have double the energy of the first RF signal pulse. This means that an NMR sensing device may vary how much power it transmits when that NMR sensing makes measurements. Yet another RF signal pulse may be referred to as an RF signal chirp that randomizes or depolarizes the proton spins at beginning of a sequence before the $1^{st}$ pulse in the T2 sequence to when a T1 sequence is performed. Such an RF signal chirp may include one or more frequencies of RF signals, may include numerous cycles of those signals, or may include a selected amplitude.

For a specific wait time, a T2 experiment or evaluation may transmitting the first (i.e., 90 degree) RF signal burst, then transmitting the second (i.e., 180 degree) RF signal burst, and then measuring the proton spin states. A T2 experiment or evaluation may also include transmitting one or more additional RF signals pulses and making proton spin state measurements for each transmitted RF signal pulse. Each set of measurements for a given wait time may be referred to as a set of echo data of an echo train 615. Points that lie on curve 620 cannot be measured directly because RF pulses are transmitted by an antenna of the NMR sensing device at this time. As such, points along curve 620 must be extrapolated from echo data collected after one or more RF signal pulses have been transmitted. This means that a location of point 617 of curve 620 may be identified by plotting curve 660 from measured data points and interpolating the location of point 617 ($A_0$) based on a wait time that corresponds to a time when RF pulses were transmitted from the NMR sensing device. Point 617 as well as echo responses may have values measured in terms of porosity units. Points along curve 620, like point 617, may be referred to as projected $A_0$ values. Porosity may be a measure of void spaces in a material. A pure liquid may have a value of 100 porosity units.

If all void space of a substance is full of hydrogen, then a total number (N) of hydrogen should be proportional to void space. So, by measuring the hydrogen magnetic moment (that represents the total number N of hydrogen) the void space (total porosity) of a material may be derived. Furthermore, the decay rate in T2 (X-Y plane) or buildup rate (in z direction) may vary with pore size. Typically, a formation has a many different pore sizes (pore size distributions), so the T2 decay curve or T1 buildup curve is the combination of, for example, 3 different pore sizes with corresponding decay rate of $\tau_1$, $\tau_2$, and $\tau_3$ and response signal amplitudes of $A_1, A_2,$ and $A_3$. In such an instance, a measured $n^{th}$ echo data $Y_n = A_1 * \exp(-n*T_e/\tau_1) + A_2*\exp(-n*T_e/\tau_2) + A_3*\exp(-n*T_e/\tau_3)$, where $T_e$ is inner echo time (the time between 2 adjacent echoes), and n=1, $1^{st}$ echo, n=2 for $2^{nd}$ echo, .... Echo $Y_1, Y_2 \ldots Y_N$ may be processed so that $(A_1, \tau_1)$, $(A_2, \tau_2)$, and $(A_2, \tau_3)$ can be derived to identify a response spectrum.

This process may be repeated for multiple different wait times, where each subsequent wait time is increased relative to a previous wait time. As such, the spins of the protons of materials may be aligned multiple times and the pulses of RF energy be transmitted after each respective wait time such that a different set of echo data may be collected. Once multiple sets of echo data are collected, curve 620 can be generated from this collected data.

The rate at which curve 620 rises and flattens out may be indicative of types of materials and/or structures of those materials that are present at particular locations of the wellbore. This means that the shape of a curve as well as characteristics of measured echo data are associated with structures and materials present at a wellbore location. Initially, curve 620 rises relatively quickly and then curve 620 flattens out as wait times tw' increase. The flattening of curve 620 indicates that $B_1$ alignment buildup rate of magnetic spins reduces as wait time tw is increased. Curve 620 may be used to identify T1 times associated with materials located in a wellbore.

Different sets of echo train data 615-1 included in graph 650 may be collected during a calibration process. Graph 650 has a vertical axis echo values and a horizontal axis of time. Graph 650 also includes a plot of several different sets of echo train data, where samples that of a first set of echo train data (echo train 1) are represented as dots (·), samples that of a second set of echo train data (echo train 2) are represented by plus signs (+), and samples of a third set of echo train data (echo train 3) are represented by circles (R). The echo train data sensed by the NRM sensing device may be influenced by noise, this is one reason why points of the different sets of echo data do not lie neatly along a line. Because of this noise, variations in the echo train data may be averaged when identifying point $A_0$ (617) that lies along T1 curve 620. This may include generating the dashed line curve 660 of FIG. 6 from these three different sets of echo train data using a curve fitting process. As such, curve 660 may be referred to as a fitted echo train curve. A projection of this curve back to the time when an RF pulse was transmitted may be used to identify the value of projected point (617) $A_0$.

Different sets of data may be collected at different temperatures. This collected data may be used to characterize how specific temperatures affect operation of an NMR sensing device that is being calibrated. These changes in temperature may result in changes in curve 620. For example, values of response magnitudes as a function of time may change with temperature. When an NMR device is calibrated in the chamber 460 of FIG. 4, known characteristics of a type of liquid used may allow for measurements performed at wellbore temperatures to be compared with measurements made at other temperatures (e.g., at 25 degrees C.) such that wellbore temperature data may be normalized or otherwise evaluated.

Figure 7:
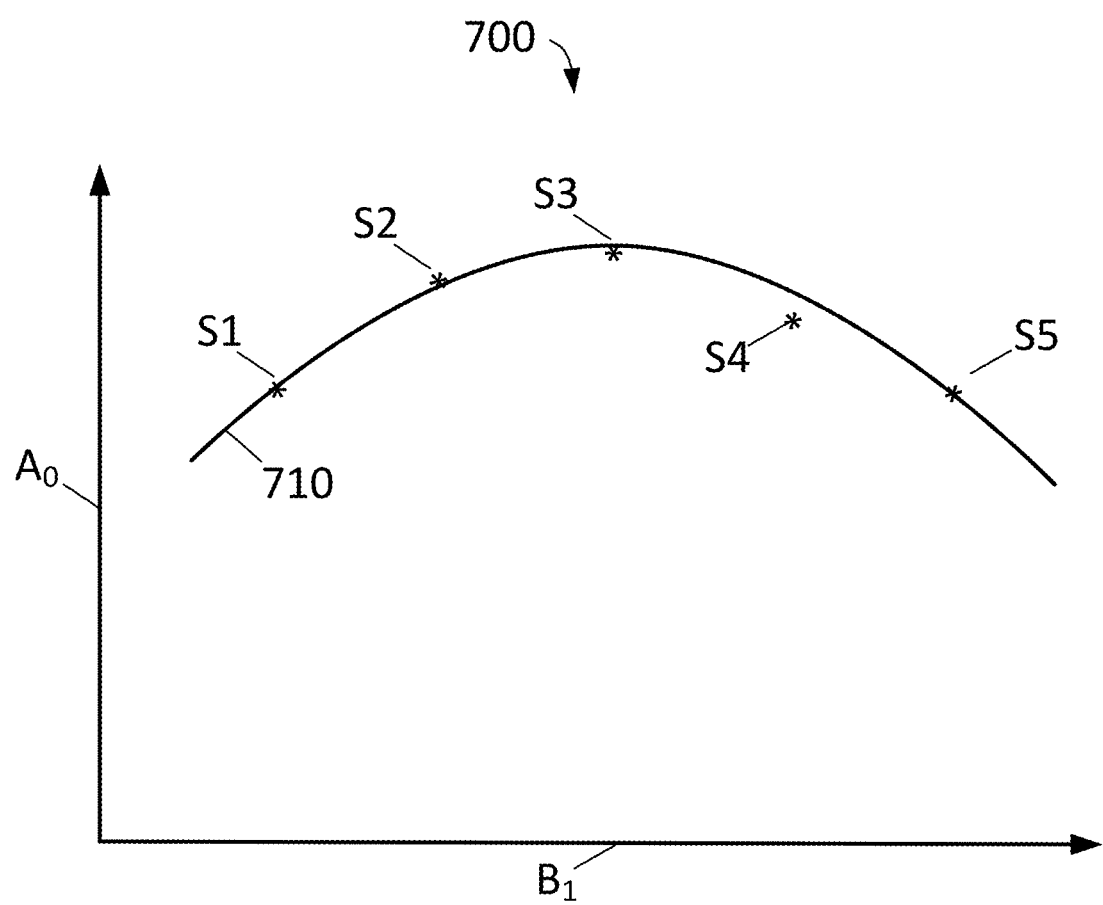
FIG. 7 illustrates a graph that cross-references response magnitudes with electromagnetic energy of a radio frequency (RF) pulse, in accordance with various aspects of the subject technology.

FIG. 7 illustrates a graph that cross-references response magnitudes with electromagnetic energy of a radio frequency (RF) pulse. The graph 700 of FIG. 7 includes vertical axis of projected values of response magnitudes $A_0$ and a horizontal axis of electromagnetic energy $B_1$. A calibration process may vary the amount of electromagnetic energy $B_1$ included in transmitted RF pulses of a particular frequency. This calibration process may also include measuring echoes and identifying a response magnitude for each RF pulse transmitted. Data points S1, S2, S3, S4, and S5 may represent data collected by an NMR sensing device respective pulses and curve 710 may be generated from data points S1, S2, S3, S4, and S5 as part of a curve fitting process. Note that initially as electromagnetic energy $B_1$ is increased, response magnitude $A_0$ also increases to a maximum magnitude at an energy associated with data point S3. As the magnitude of electromagnetic energy $B_1$ is increased further after data point S3, response magnitude $A_0$ decreases. The energy level of a transmitted RF pulse used to collect data point S3 may be used during the calibration process whenever a frequency of the RF pulses of the particular frequency used to collect the data of FIG. 7. An energy of an applied RF signal may correspond to the $B_1$ value at point S3 of curve 710.

Data points S1, S2, S3, S4, and S5 may be collected at a particular temperature after which other sets of data points may be collected at various different temperatures. This would result in data being collected that characterizes how response magnitudes $A_0$ vary with specific values of electromagnetic energy $B_1$ and temperature. Such a process may also include changing the frequency of emitted RF pulses such that evaluations associated with different radii can be performed from collected data. The use of a calibration chamber like chamber 460 of FIG. 4 allows operators to collect data using different temperatures T, different amounts of RF energy $B_1$, and different frequencies of RF signal pulses such that variations is response magnitudes $A_0$ associated with these different factors may be identified. All or a portion of this collected data may be used to collect data that a computer may access when evaluations are performed on data collected when the NMR device is deployed in a wellbore.

Figure 8:
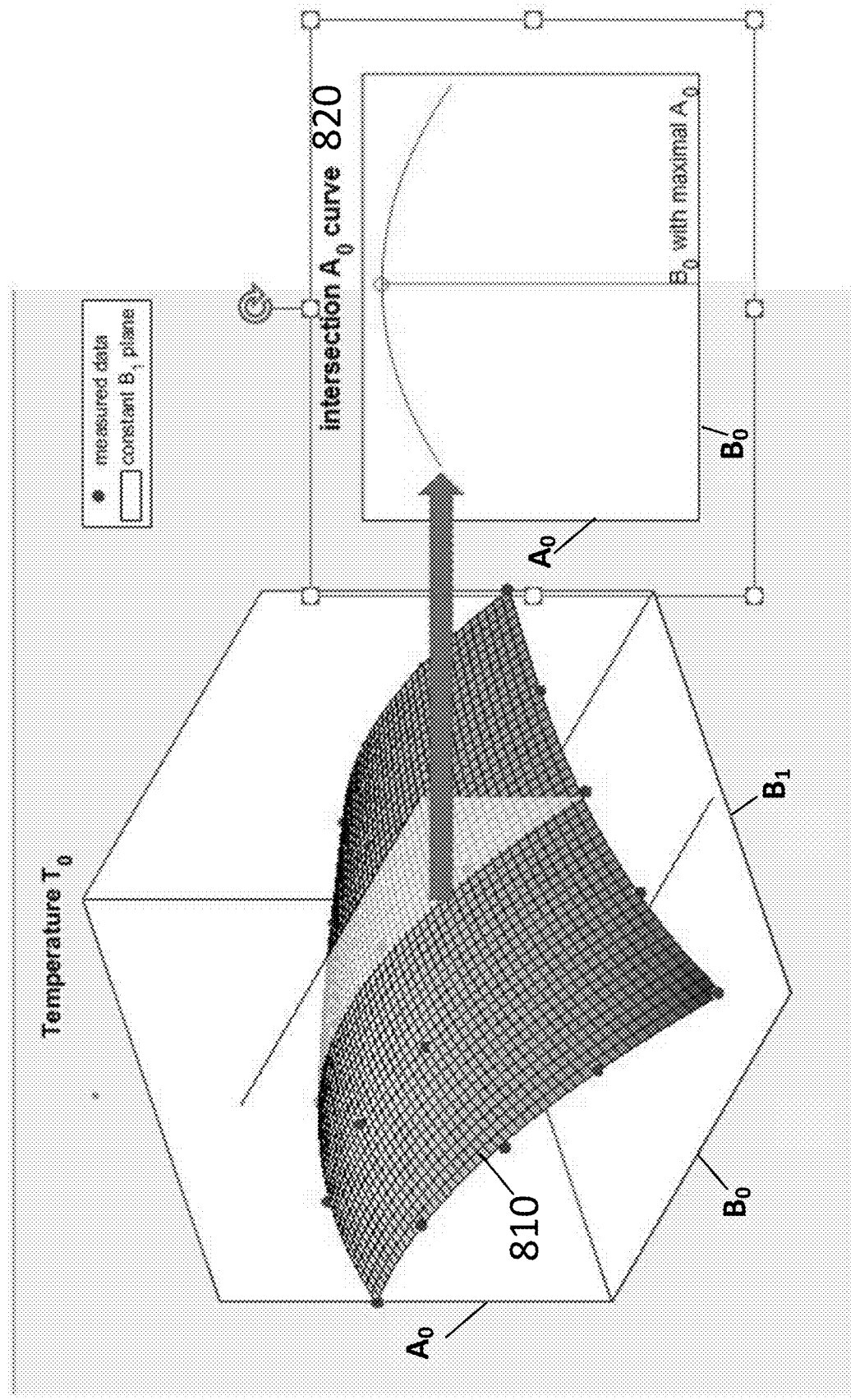
FIG. 8 illustrates curves that may be used to identify operating characteristics of a sensing device, in accordance with various aspects of the subject technology.

FIG. 8 illustrates curves that may be used to identify operating characteristics of a sensing device. FIG. 8 includes a first curve 810 plotted in three-dimensional (3D) space. This 3D space may include a vertical axis of response magnitude $A_0$, a second axis of electromagnetic magnetic field strength $B_1$, and a third axis of applied magnetic field strength $B_0$. The 3D curve 810 plots variations in applied magnetic field, magnetic field of an RF pulse, versus response magnitude $A_0$ for particular measures of $B_1$ generated by specific frequencies of RF pulses. This 3D curve 810 may have been drawn by curve fitting discrete points of sensed data as represented by the dots in 3D curve 810. Two-dimensional (2D) space intersection curve 820 may have been generated from 3D curve 810 by cutting a slice out of curve 810 along a value of $B_1$. This 2D intersection space has a vertical axis of response magnitude $A_0$ and a horizontal axis of applied magnetic field $B_0$. Curve 820, therefore shows how measured data can be used to identify, for a given RF pulse energy, an amount of magnetic field $B_0$ that provides a maximum response magnitude $A_0$.

Figure 9:
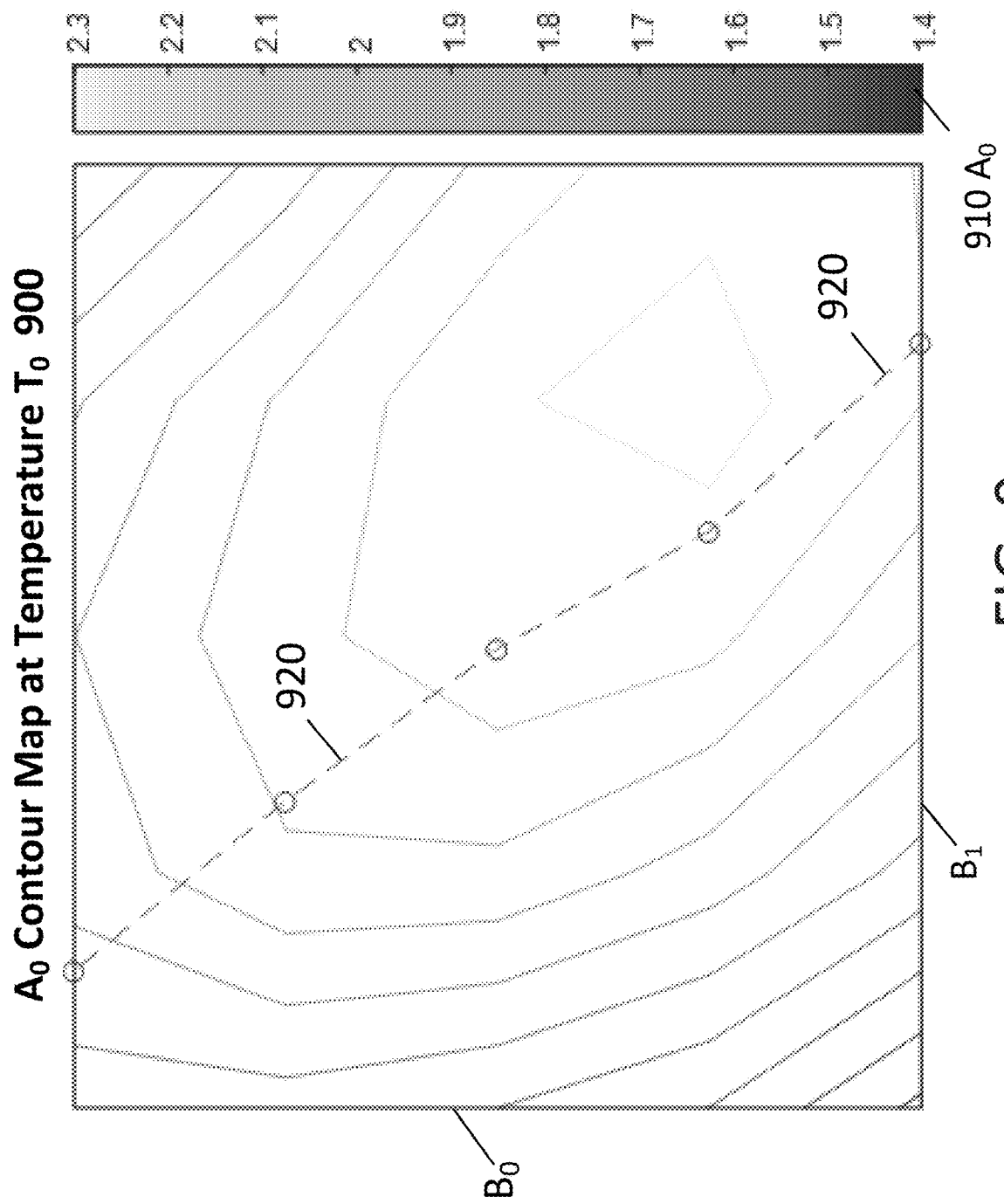
FIG. 9 illustrates a response magnitude contour mapping of nuclear magnetic resonance data collected at a particular temperature, in accordance with various aspects of the subject technology.

FIG. 9 illustrates a response magnitude contour mapping of NMR data collected at a particular temperature. The mapping 900 of FIG. 9 includes a vertical axis of applied magnetic field $B_0$ and a horizontal axis of electromagnetic energy $B_1$ acquired at temperature $T_0$. FIG. 9 includes scale 910 $A_0$ that shows changes in response magnitudes $A_0$ as changes in color or gray scale. Lines included in map 900 correspond to the color or gray scale response magnitudes $A_0$. Line 920 illustrates a combination of energy $B_1$ (for a given RF pulse frequency) with a corresponding $B_0$ for the given temperature To. Points along line 920 may identify a maximum response for a given energy $B_1$ with a corresponding $B_0$. Mappings like mapping 900 may be created from data collected at different temperatures. Data from these different mappings may be used to generate curves included in FIG. 10.

Figure 10:
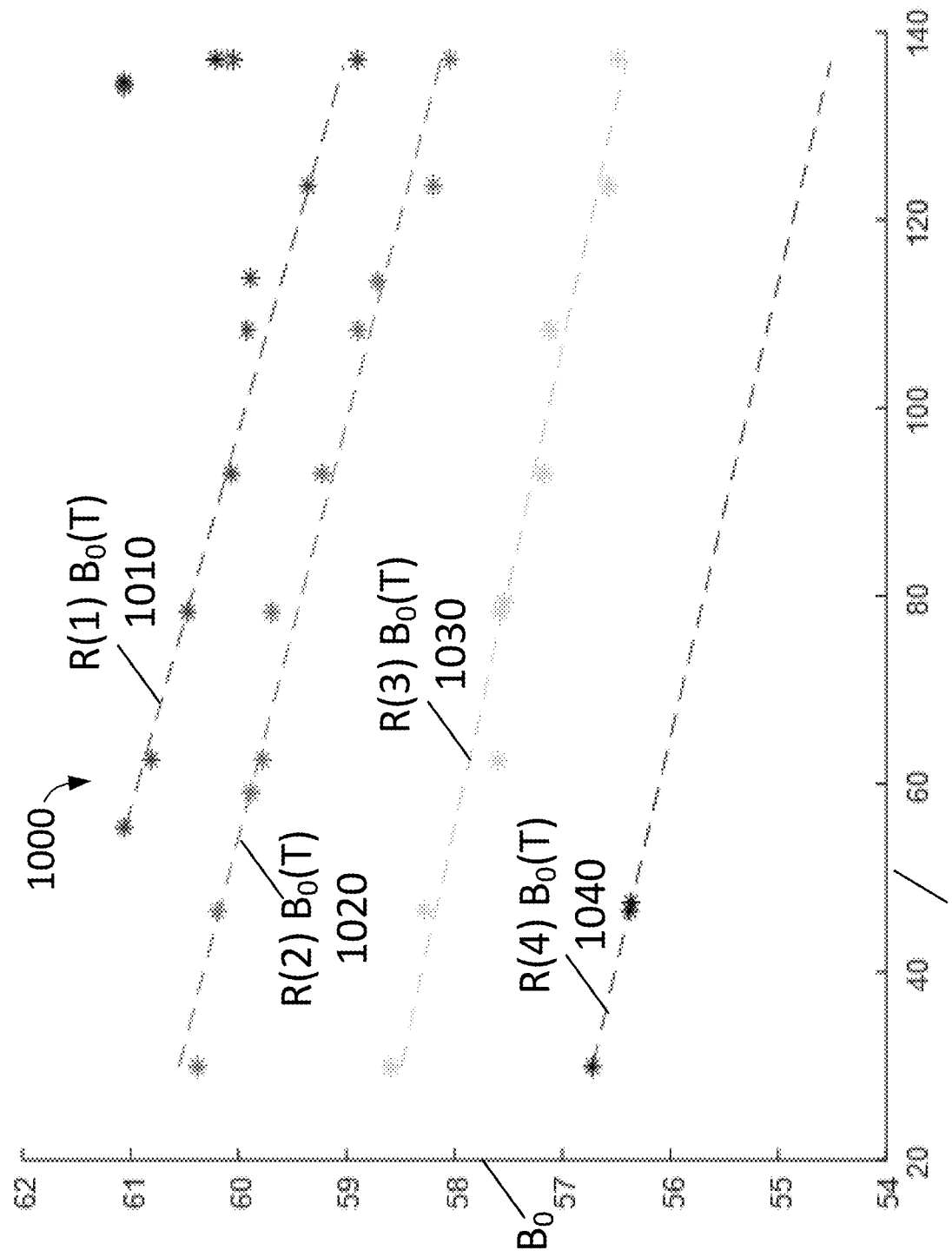
FIG. 10 illustrates how values of applied magnetic field vary with distance and temperature, in accordance with various aspects of the subject technology.

FIG. 10 illustrates how values of applied magnetic field vary with distance and temperature. A vertical axis includes values of applied magnetic field $B_0$ and horizontal axis of temperature T. Graph 1000 includes several curves 1010, 1020, 1030, and 1040 generated from collected data. Each of curves 1010, 1020, 1030, and 1040 may be respectively associated with radius R1, radius R2, radius R3, and radius R4. Note that values of applied magnetic field $B_0$ reduce with both radius and temperature T. Each of the different radius may be sensitive to a different RF signal frequency as the resonant frequency hydrogen proton spins may vary with both the magnitude of an applied magnetic field, the magnitude of a magnetic field of an RF signal pulse, and an excitation frequency. Because of this, data used to generate curves 1010, 1020, 1030, and 1040 may be collected using different frequencies of transmitted RF signal pulses that are consistent with formula $f=\gamma*B_0$, discussed above.

Figure 11:
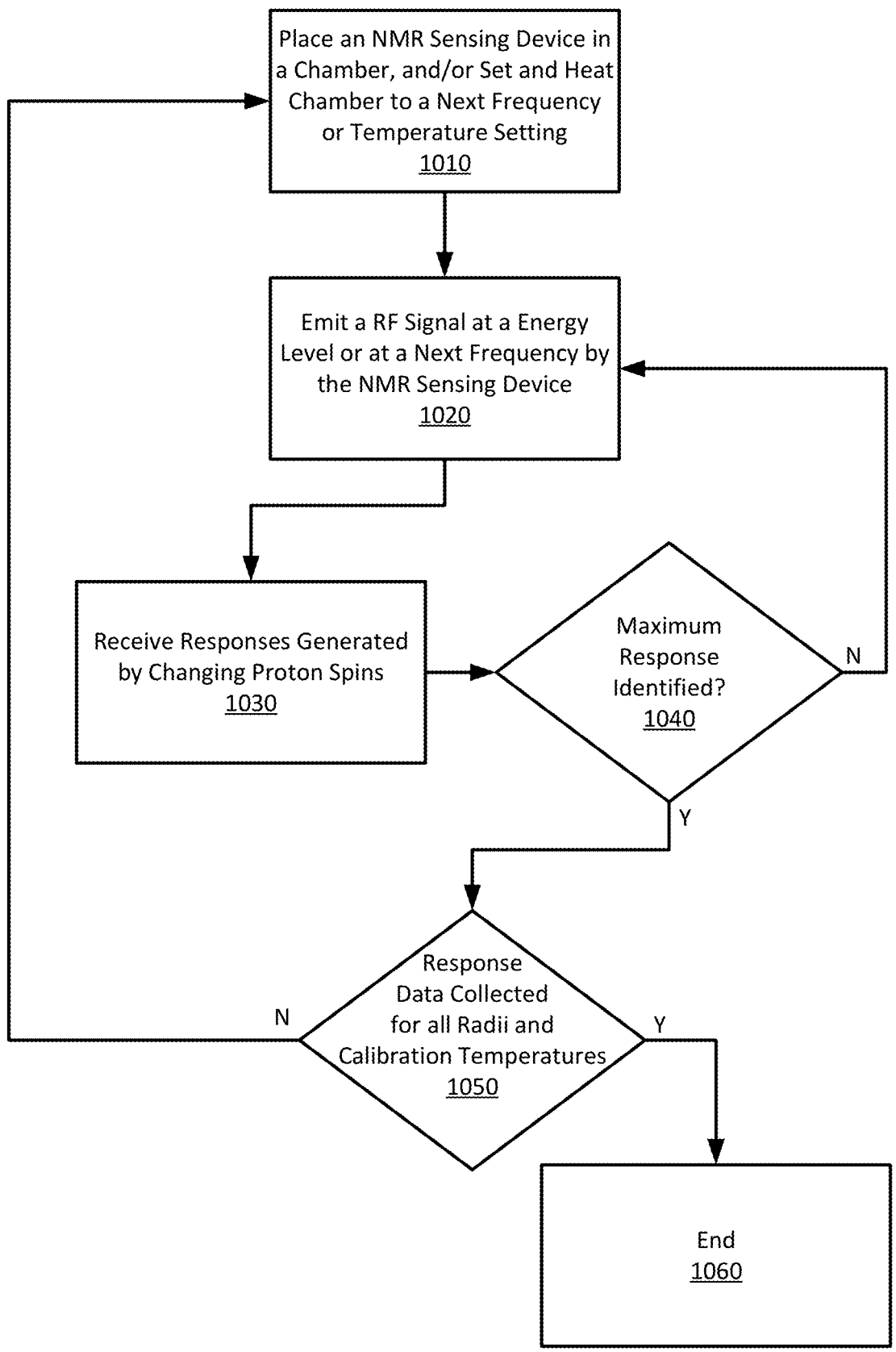
FIG. 11 illustrates an example process that may be performed when a nuclear magnetic resonance sensing device is calibrated, in accordance with various aspects of the subject technology.

FIG. 11 illustrates an example process that may be performed when a nuclear magnetic resonance sensing device is calibrated. At block 1110, an NMR sensing device may be placed in a chamber like chamber 460 of FIG. 4. Here again, the chamber may be a thermal chamber that is configured to be heated to temperatures that are commonly encountered in a wellbore. The chamber may be designed to shield the NMR sensing device and the sample from electric and/or magnetic fields that could affect accuracy of the NMR sensing device. A chamber temperature may be set, and the chamber may be heated to a first temperature at block 1110. This chamber may also be designed to isolate the chamber from vibrations that could affect the accuracy of the NMR sensing device, for example, the chamber may be shock mounted. Additionally or alternatively, the chamber may be placed on a mass (e.g., a granite block) to dampen vibrations that might otherwise affect the NMR sensing device. A chamber temperature may be set and the chamber may be heated to a first temperature at block 1110.

After the chamber has reached temperature, the spins of the hydrogen atoms included in the sample may be aligned and a radio frequency (RF) signal pulse may be transmitted at block 1120. This may include transmitting the RF signal pulse at a frequency and at an energy that corresponds to making measurements at a first radius as determined by the formula $f=\gamma*B_0$. At block 1130, responses to that transmitted RF signal pulse may be received. The responses measured at block 1130 may correspond to disturbances in the spins of the hydrogen protons located at a radius associated with a distance (radius) from the NMR sensing device. At block 1140 a determination may be made as to whether a maximum response has been identified for a given RF signal pulse frequency. When determination block 1140 identifies that a maximum response has not been identified, program flow may move back to block 1120 where an RF signal pulse that has a next energy level is transmitted. Actions performed at blocks 1120, 1130, and 1140 may be performed until a maximum response is identified. This may include plotting a graph like curve 710 of FIG. 7 using collected data. By changing the energy included in an RF signal pulse of a particular frequency, an amount of magnetic field $B_1$ associated with the transmitted pulses will change. This will allow for a maximum response to be identified for a particular frequency. Once a maximum response is identified for a current RF signal frequency, a determination may be made at block 1050 as to whether response data has been collected for all radii (or calibration frequencies) and with all temperatures, when no program flow may move back to block 1110 where a next frequency or temperature is set.

A calibration process may include transmitting RF signal pulses at different energies and transmitting different frequency signals such that responses associated a particular temperature may be identified. The process may be repeated at a next temperature. The actions of FIG. 11 may be repeated numerous times, each time with a different set of constraints (temperature, transmission energy, and frequency). When determination block 1150 identifies that response data has been collected for all radii (based on transmission frequency) and all temperatures, the process may end at block 1160.

After the calibration data is collected, the NMR sensing device may be deployed in a wellbore. A temperature sensor deployed in the wellbore with the NMR sensing device may provide temperature data to a controller that controls operation of the NMR sensing device. This controller may identify the temperature of the wellbore, and then access the stored calibration data to identify RF signal energy and transmission frequencies that should be used to collect data from materials near the wellbore.

Figure 12:
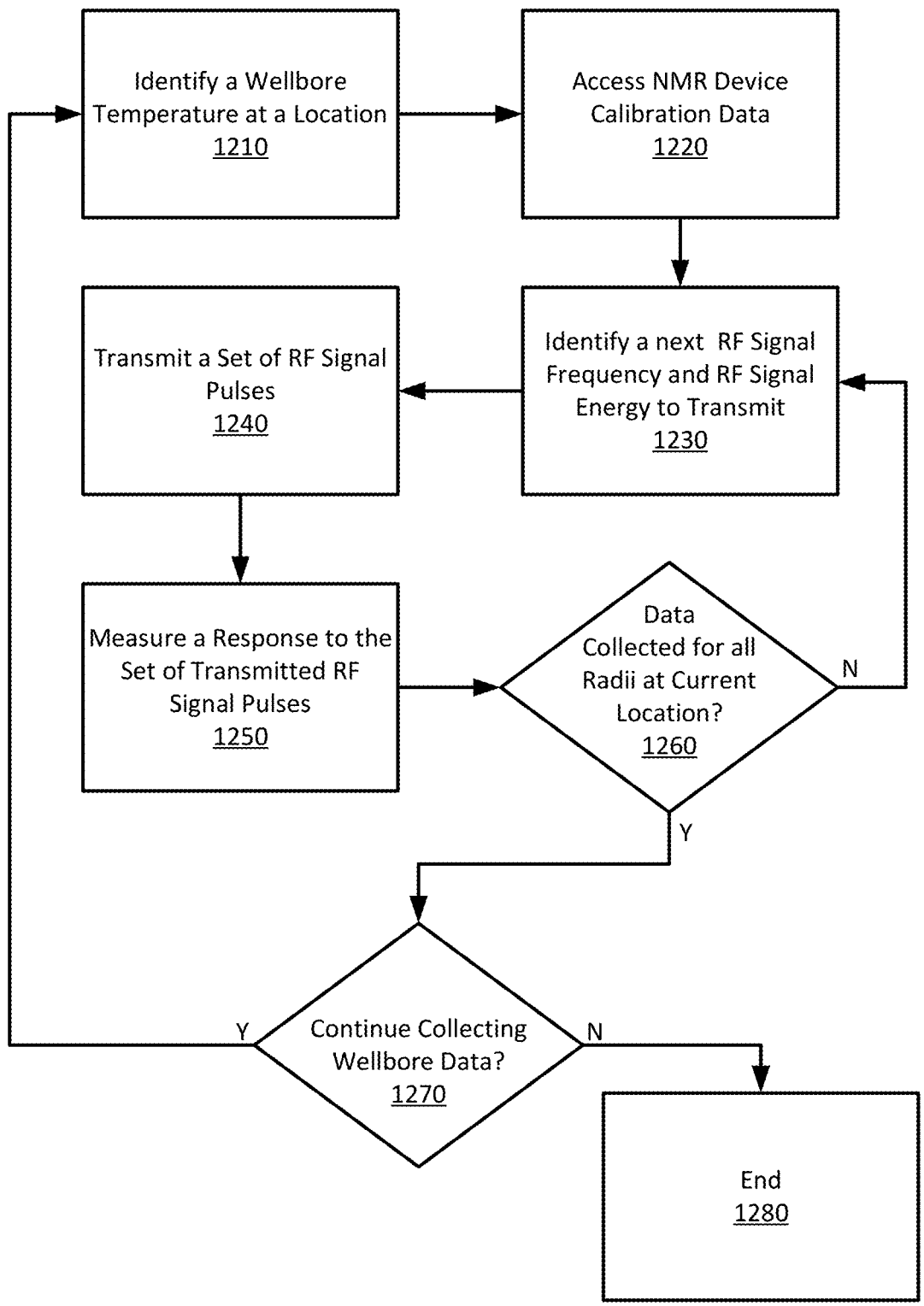
FIG. 12 illustrates an example process that may be performed when a calibrated nuclear magnetic resonance sensing device is deployed in a wellbore, in accordance with various aspects of the subject technology.

FIG. 12 illustrates an example process that may be performed when a calibrated nuclear magnetic resonance sensing device is deployed in a wellbore. At block 1210, a temperature at a wellbore may be identified when the previously-calibrated NMR sensing device is deployed at a location in the wellbore. This temperature may be identified based on data received from a sensor included in or coupled to a controller of the NMR sensing device. At block 1220 calibration data may be accessed to identify a set of RF signal frequencies and RF signal energies that may be used to collect data from the wellbore location based on the identified temperature. At block 1230, an RF signal frequency and an RF signal energy may be identified. At block 1240, a set of RF signal pulses may be transmitted at the identified frequency and energy level. Responses to the transmitted set of RF signal pulses may be measured at block 1250. Determination block 1260 may identify whether data associated with all radii (or a set of frequencies) have been collected, when yes the process may move back to block 1230 where another RF signal frequency and/or energy may be identified such that additional data may be collected. Each different frequency used may correspond to a resonant frequency of hydrogen proton spins located at a particular distance (radius) from the NMR sensing device.

When determination block 1260 identifies that data has been collected at all radii (or the set of frequencies) at the current location, determination block 1270 may identify whether data collection should be continued. When additional data should be collected, the process may move back to block 1210 where the wellbore temperature is identified again. When no additional data should be collected, the process of FIG. 12 may end at block 1280.

Figure 13:
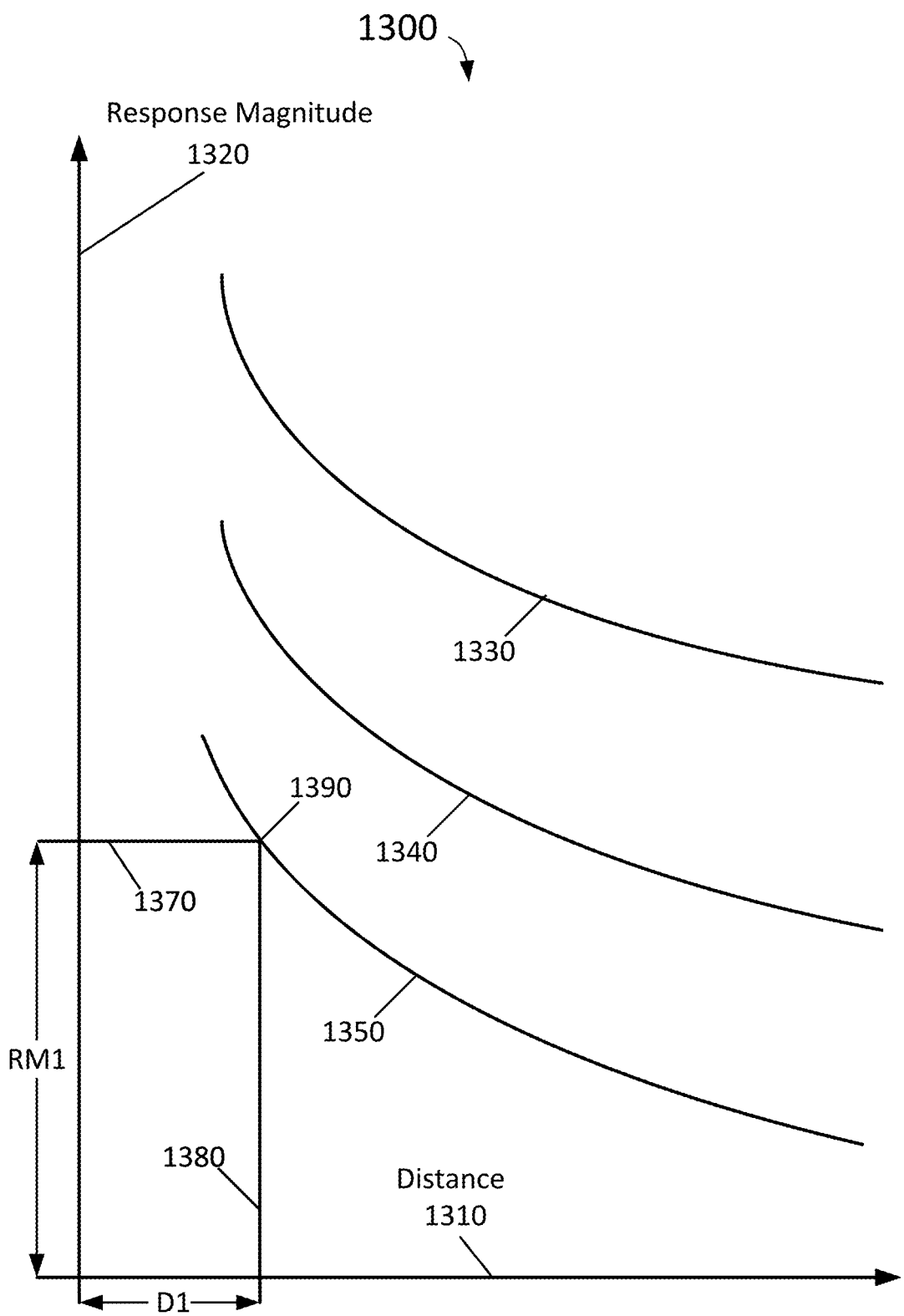
FIG. 13 includes a set of curves that shows how response magnitudes may vary with temperature and distance for an NMR sensing device, in accordance with various aspects of the subject technology.

FIG. 13 includes a set of curves that shows how response magnitudes may vary with temperature and distance for an NMR sensing device. Graph 1300 of FIG. 13 includes horizontal axis 1310 that corresponds to distances from an NMR sensing device and includes vertical axis 1320 that corresponds to magnitudes of received response signals. Each of curves 1330, 1340, and 1350 illustrates magnitudes of responses changing with distance for a specific temperature in a given NMR sensing device configuration. For example, curve 1330 can identify a response strength at 30 degrees C., curve 1340 can identify a response strength at 60 degrees C., and curve 1350 can identify a response at 90 degrees C. Because of this, curves 1330, 1340 and 1350 of FIG. 13 may be used to identify how response strengths vary with distance between the NMR sensing device and a sample near the NMR sensing device. The locations of curves 1330, 1340, and 1350 may be a function of a magnetic field strength provided by the NMR sensing device magnet at the respective temperatures, such as 30 degrees C., 60 degrees C., and 90 degrees C. in the previous example. These curves may also correspond to a respective distance (radius) from the NMR sensing device and a respective stimulation frequency.

In certain instances, a frequency of an RF signal that should generate a largest magnitude response for a temperature not included in a set of calibration data may be estimated bay making interpolations from collected data. For example, a curve associated with a temperature of 45 degrees C. should be located between curve 1330 and 1340. As such, an RF signal frequency used at an uncalibrated temperature may be estimated from a temperature difference between a chosen calibrated temperature and the uncalibrated temperature and by interpolating a data point on an imaginary curve. This may include assuming that the imaginary curve should be parallel to curves of a set of calibration data. Similar interpolations may be made between RF signal frequencies used to collect data of curve 1330 and curve 1340. Formula $f=\gamma*B_0$ may also be used to identify an RF signal frequency.

As discussed with respect to FIG. 12, a controller of an NMR sensing device may identify a temperature from data received by a temperature sensor. Once the temperature is known, the controller of the NMR sensing device may identify a frequency and possibly an energy of an RF signal that can induce a maximum transition (or disruption) in magnitude in spins of hydrogen protons located near the NMR sensing device. The controller may initiate transmission of the RF signal by the NMR sensing device and a response may be measured by the NMR sensing device. Since the frequency of the RF signal used to induce a maximum disruption is chosen based on temperature, a magnitude of response signal may be used to identify a distance that separates a substance in the wellbore from the NMR sensing device.

In an instance when curve 1350 identifies magnetic field strengths of responses versus distance at 90 degrees C. and when a magnitude of response measurement RM1 has been measured, a distance (D1) that separates the NMR sensing device from the substance may be identified. Under such conditions, horizontal line 1370 may be used to identify point 1390 on curve 1350 and vertical line 1380 may be used to identify a value of distance D1. This means the distance between the NMR sensing device and a substance (e.g., distance D1) may be identified by comparing a currently measured response value magnitude (e.g., RM1) collected at a current temperature (e.g., 90 degrees C.) with previously collected calibration data (e.g., data of curve 1350) associated with the current temperature. The curves of FIG. 13 may be similar to curves that show how the magnetic field strength of the NMR sensing device magnet varies with temperatures.

Figure 14:
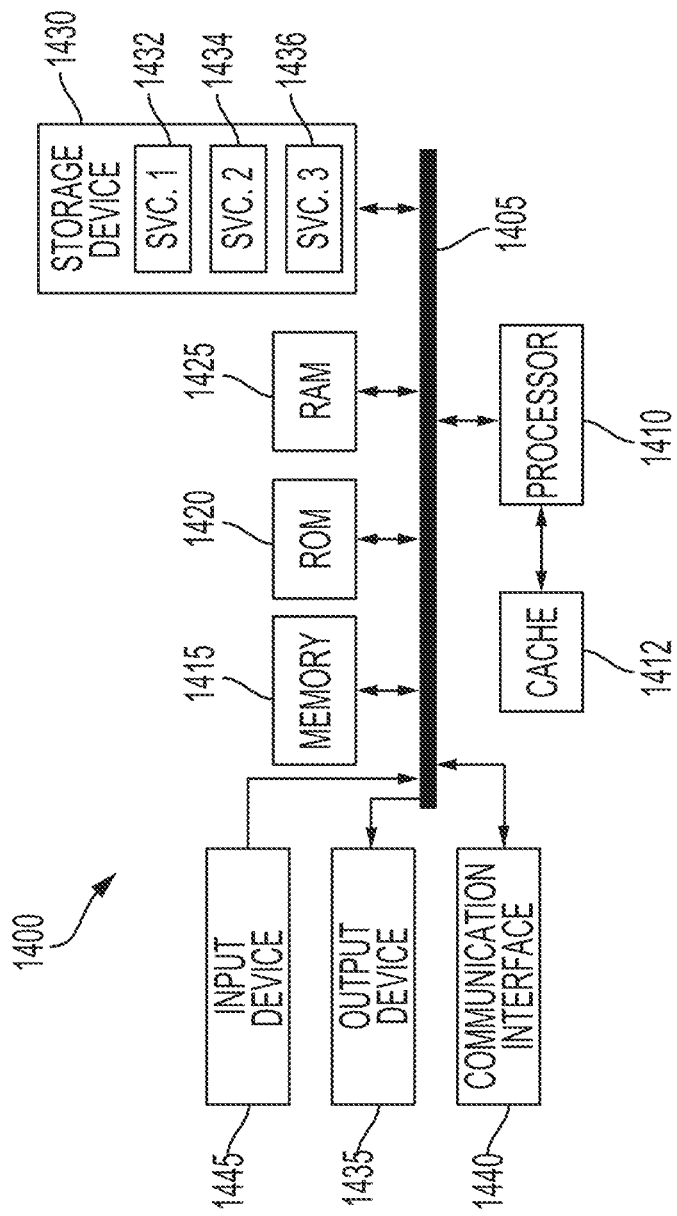
FIG. 14 illustrates an example computing device architecture which can be employed to perform any of the systems and techniques described herein.

FIG. 14 illustrates an example computing device architecture which can be employed to perform any of the systems and techniques described herein. In some examples, the computing device 1400 architecture can be integrated with tools described herein. The components of the computing device architecture 1400 are shown in electrical communication with each other using a connection 1405, such as a bus. The example computing device architecture 1400 includes a processing unit (CPU or processor) 1410 and a computing device connection 1405 that couples various computing device components including the computing device memory 1415, such as read only memory (ROM) 1420 and random access memory (RAM) 1425, to the processor 1410.

The computing device architecture 1400 can include a cache of high-speed memory connected directly with, in close proximity to, or integrated as part of the processor 1410. The computing device architecture 1400 can copy data from the memory 1415 and/or the storage device 1430 to the cache 1412 for quick access by the processor 1410. In this way, the cache can provide a performance boost that avoids processor 1410 delays while waiting for data. These and other modules can control or be configured to control the processor 1410 to perform various actions. Other computing device memory 1415 may be available for use as well. The memory 1415 can include multiple different types of memory with different performance characteristics. The processor 1410 can include any general-purpose processor and a hardware or software service, such as service 1 1432, service 2 1434, and service 3 1436 stored in storage device 1430, configured to control the processor 1410 as well as a special-purpose processor where software instructions are incorporated into the processor design. The processor 1410 may be a self-contained system, containing multiple cores or processors, a bus, memory controller, cache, etc. A multi-core processor may be symmetric or asymmetric.

To enable user interaction with the computing device architecture 1400, an input device 1445 can represent any number of input mechanisms, such as a microphone for speech, a touch-sensitive screen for gesture or graphical input, keyboard, mouse, motion input, speech and so forth. An output device 1435 can also be one or more of a number of output mechanisms known to those of skill in the art, such as a display, projector, television, speaker device, etc. In some instances, multimodal computing devices can enable a user to provide multiple types of input to communicate with the computing device architecture 1400. The communications interface 1440 can generally govern and manage the user input and computing device output. There is no restriction on operating on any particular hardware arrangement and therefore the basic features here may easily be substituted for improved hardware or firmware arrangements as they are developed.

Storage device 1430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 1425, read only memory (ROM) 1420, and hybrids thereof. The storage device 1430 can include services 1432, 1434, 1436 for controlling the processor 1410. Other hardware or software modules are contemplated. The storage device 1430 can be connected to the computing device connection 1405. In one aspect, a hardware module that performs a particular function can include the software component stored in a computer-readable medium in connection with the necessary hardware components, such as the processor 1410, connection 1405, output device 1435, and so forth, to carry out the function.

For clarity of explanation, in some instances the present technology may be presented as including individual functional blocks including functional blocks comprising devices, device components, steps or routines in a method implemented in software, or combinations of hardware and software.

In some instances, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific examples and aspects thereof, but those skilled in the art will recognize that the application is not limited thereto. Thus, while illustrative examples and aspects of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, examples and aspects of the systems and techniques described herein can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate examples, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Methods and apparatus of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Such methods may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or another word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative Aspects of the Disclosure Include:

Aspect 1: A method comprising placing a nuclear magnetic resonance (NMR) sensing device in a calibration chamber; obtaining, from the NMR sensing device, a plurality of measurements associated with a calibration medium; identifying a first radio frequency (RF) signal that stimulates a maximum observed transition magnitude when the first RF signal is transmitted into the calibration medium and when the calibration chamber is at a first temperature; identifying a second RF signal that stimulates the maximum observed transition magnitude associated when the second RF signal frequency is transmitted when the calibration chamber is at a second temperature; and associating the first temperature with the first RF signal and the second temperature with the second RF signal in a set of calibration data that cross-references: the first temperature with the first RF signal, and the second temperature with the second RF signal, wherein the calibration data is accessed when data collected at wellbore is evaluated to identify a characteristic of the wellbore.

Aspect 2: The method of Aspect 1, wherein one or more operating characteristics associated with the NMR sensing device include: a temperature of a plurality of temperatures, one or more distances between the NMR sensing device and respective portions of the calibration medium, one or more RF signal frequencies transmitted into the calibration medium, a longitudinal relaxation time, and a transition magnitude that is associated with a respective magnetic field tipping angle of a plurality of magnetic field tipping angles.

Aspect 3: The method of any of Aspects 1 through 2, further comprising identifying that a particular temperature of a location within a wellbore where the NMR sensing device is deployed matches the second temperature; selecting the second RF signal for the location within the wellbore based on calibration data that cross-references the second temperature with the second RF signal; emitting, from the NMR sensing device into the location within the wellbore, the second RF signal at an RF signal energy; collecting, by the NMR sensing device, data associated with a substance at the location within the wellbore; and identifying a composition of the substance based on the data associated with the substance.

Aspect 4: The method of any of Aspects 1 through 4, further comprising identifying that a wellbore temperature at a location where the NMR sensing device is deployed is between the first temperature and the second temperature; identifying a temperature difference between the first temperature and the wellbore temperature; estimating an RF frequency of a third RF signal to associate with the wellbore temperature based on at least the temperature difference; emitting the third RF signal toward the wellbore at the RF frequency; collecting, by the NMR sensing device, data associated with a substance located within the wellbore based on the third RF signal emitted at the third RF frequency; and identifying a composition of the substance based on the collected data.

Aspect 5: The method of any of Aspects 1 through 5, wherein the plurality of measurements includes data collected at one or more additional temperatures in the calibration chamber.

Aspect 6: The method of any of Aspects 1 through 5, further comprising generating a series of curves from data associated with the plurality of measurements, wherein each respective curve from the series of curves: is associated with a respective temperature, and cross-references a respective set of temperature related response measurement values with a plurality of distances between the NMR sensing device and the calibration medium.

Aspect 7: The method of any of Aspects 1 through 6, further comprising identifying that a particular temperature at a location within a wellbore where the NMR sensing device is deployed matches the second temperature; identifying that the second RF signal should be emitted based on the particular temperature matching the second temperature; emitting, from the NMR sensing device toward a substance associated with the location within the wellbore, the second RF signal frequency at an RF signal energy level that corresponds to a set of calibration data; collecting, by the NMR sensing device, data associated with the substance; and identifying a distance that separates the NMR sensing device from the substance based on a value of response magnitude received at the NMR sensing device that corresponds to the set of calibration data associated with the second temperature.

Aspect 8: The method of any of Aspects 1 through 7, further comprising measuring a transverse relaxation (T2) time; and identifying the maximum observed transition magnitude based on the measured T2 time.

Aspect 9: The method of any of Aspects 1 through 8, wherein the first RF signal is transmitted at a first RF signal energy level and the second RF signal is transmitted at a second RF signal energy level.

Aspect 10: The method of Aspect 9, wherein the first RF signal energy level and the second RF energy level are the same.

Aspect 11: A non-transitory computer-readable storage medium having embodied thereon instructions executable by one or more processors to implement a method comprising: obtaining, from a nuclear magnetic resonance (NMR) sensing device placed in a calibration chamber, a plurality of measurements associated with a calibration medium; identifying a first radio frequency (RF) signal that stimulates a maximum observed transition magnitude when the first RF signal is transmitted into the calibration medium and when the calibration chamber is at a first temperature; identifying a second RF signal that stimulates the maximum observed transition magnitude associated when the second RF signal frequency is transmitted when the calibration chamber is at a second temperature; and associating the first temperature with the first RF signal and the second temperature with the second RF signal in a set of calibration data that cross-references: the first temperature with the first RF signal, and the second temperature with the second RF signal, wherein the calibration data is accessed when data collected at wellbore is evaluated to identify a characteristic of the wellbore.

Aspect 12: The non-transitory computer-readable storage medium of Aspect 11, wherein one or more operating characteristics associated with the NMR sensing device include: a temperature of a plurality of temperatures, one or more distances between the NMR sensing device and respective portions of the calibration medium, one or more RF signal frequencies transmitted into the calibration medium, a longitudinal relaxation time, and a transition magnitude that is associated with a respective magnetic field tipping angle of a plurality of magnetic field tipping angles.

Aspect 13: The non-transitory computer-readable storage medium of Aspects 11 or 12, wherein the one or more processors also execute the instructions to: identify that a particular temperature of a location within a wellbore where the NMR sensing device is deployed matches the second temperature; select the second RF signal for the location within the wellbore based on calibration data that cross-references the second temperature with the second RF signal; emit, from the NMR sensing device into the location within the wellbore, the second RF signal at an RF signal energy; collect, by the NMR sensing device, data associated with a substance at the location within the wellbore; and identify a composition of the substance based on the data associated with the calibration medium.

Aspect 14: The non-transitory computer-readable storage medium of any of Aspects 11 through 13, wherein the one or more processors also execute the instructions to: identify that a wellbore temperature at a location where the NMR sensing device is deployed is between the first temperature and the second temperature; identify a temperature difference between the first temperature and the wellbore temperature; estimate an RF frequency of a third RF signal to associate with the wellbore temperature based on at least the temperature difference; emit the third RF signal toward the wellbore at the RF frequency; collect, by the NMR sensing device, data associated with a substance located within the wellbore based on the third RF signal emitted at the third RF frequency; and identify a composition of the substance based on the collected data.

Aspect 15: The non-transitory computer-readable storage medium of any of Aspects 11 through 14, wherein the plurality of measurements includes data collected at one or more additional temperatures in the calibration chamber.

Aspect 16: The non-transitory computer-readable storage medium of any of Aspects 11 through 15, wherein the one or more processors also execute the instructions to: generate a series of curves from data associated with the plurality of measurements, wherein each respective curve from the series of curves: is associated with a respective temperature, and cross-references a respective set of temperature related response measurement values with a plurality of distances between the NMR sensing device and respective portions of the calibration medium.

Aspect 17: The non-transitory computer-readable storage medium of any of Aspects 11 through 16, wherein the one or more processors also execute the instructions to: identify that a particular temperature at a location within a wellbore where the NMR sensing device is deployed matches the second temperature; identify that the second RF signal should be emitted based on the particular temperature matching the second temperature; emit, from the NMR sensing device toward a substance associated with the location within the wellbore, the second RF signal frequency at an RF signal energy level that corresponds to a set of calibration data; collect, by the NMR sensing device, data associated with the substance; and identify a distance that separates the NMR sensing device from the substance based on a value of response magnitude received at the NMR sensing device that corresponds to the set of calibration data associated with the second temperature.

Aspect 18: The non-transitory computer-readable storage medium of any of Aspects 11 through 17, wherein the one or more processors also execute the instructions to: measure a transverse relaxation (T2) time; and identify the maximum observed transition magnitude based on the measured T2 time.

Aspect 19: The non-transitory computer-readable storage medium of Aspect 18s 11 through Aspect 19: An apparatus comprising: a temperature-controlled isolation chamber;

a nuclear magnetic resonance (NMR) sensing device that is placed in the temperature-controlled isolation chamber, wherein the NMR sensing device obtains a plurality of measurements associated with the sample; a memory; and one or more processors that execute instructions out of the memory to: identify a first radio frequency (RF) signal that stimulates a maximum observed transition magnitude when the first RF signal is transmitted into the calibration medium and when the calibration chamber is at a first temperature, identify a second RF signal that stimulates the maximum observed transition magnitude associated when the second RF signal frequency is transmitted when the calibration chamber is at a second temperature, and associate the first temperature with the first RF signal and the second temperature with the second RF signal in a set of calibration data that cross-references: the first temperature with the first RF signal, and the second temperature with the second RF signal, wherein the calibration data is accessed when data collected at wellbore is evaluated to identify a characteristic of the wellbore.

Aspect 20: The apparatus of Aspect 19, further comprising one or more elements that isolate an internal portion of the temperature-controlled isolation chamber from an environment outside of the temperature-controlled isolation chamber, wherein the one or more of: a magnetic shielding material; a RF shielding material; or a vibration isolation system.

What is claimed is:

1. A method comprising:
   placing a nuclear magnetic resonance (NMR) sensing device in a calibration chamber;
   obtaining, from the NMR sensing device, a plurality of measurements associated with a calibration medium;
   identifying a first radio frequency (RF) signal that stimulates a maximum observed transition magnitude when the first RF signal is transmitted into the calibration medium and when the calibration chamber is at a first temperature;
   identifying a second RF signal that stimulates the maximum observed transition magnitude when the second RF signal is transmitted and when the calibration chamber is at a second temperature; and
   associating the first temperature with the first RF signal and the second temperature with the second RF signal in a set of calibration data that cross-references:
   the first temperature with the first RF signal, and
   the second temperature with the second RF signal, wherein the calibration data is accessed when data collected at a wellbore is evaluated to identify a characteristic of the wellbore.

2. The method of claim 1, wherein one or more operating characteristics associated with the NMR sensing device include:
   a temperature of a plurality of temperatures,
   one or more distances between the NMR sensing device and respective portions of the calibration medium,
   one or more RF signal frequencies transmitted into the calibration medium,
   a longitudinal relaxation time, and
   a transition magnitude that is associated with a respective magnetic field tipping angle of a plurality of magnetic field tipping angles.

3. The method of claim 1, further comprising:
   identifying that a particular temperature of a location within the wellbore where the NMR sensing device is deployed matches the second temperature;
   selecting the second RF signal for the location within the wellbore based on calibration data that cross-references the second temperature with the second RF signal;
   emitting, from the NMR sensing device into the location within the wellbore, the second RF signal at an RF signal energy;
   collecting, by the NMR sensing device, data associated with a substance at the location within the wellbore; and
   identifying a composition of the substance based on the data associated with the substance.

4. The method of claim 1, further comprising:
   identifying that a wellbore temperature at a location where the NMR sensing device is deployed is between the first temperature and the second temperature;
   identifying a temperature difference between the first temperature and the wellbore temperature;
   estimating an RF frequency of a third RF signal to associate with the wellbore temperature based on at least the temperature difference;
   emitting the third RF signal toward the wellbore at the RF frequency;
   collecting, by the NMR sensing device, data associated with a substance located within the wellbore based on the third RF signal emitted at the RF frequency; and
   identifying a composition of the substance based on the collected data.

5. The method of claim 1, wherein the plurality of measurements includes data collected at one or more additional temperatures in the calibration chamber.

6. The method of claim 1, further comprising:
generating a series of curves from data associated with the plurality of measurements, wherein each respective curve from the series of curves:
is associated with a respective temperature, and
cross-references a respective set of temperature related response measurement values with a plurality of distances between the NMR sensing device and the calibration medium.

7. The method of claim 1, further comprising:
identifying that a particular temperature at a location within a wellbore where the NMR sensing device is deployed matches the second temperature;
identifying that the second RF signal should be emitted based on the particular temperature matching the second temperature;
emitting, from the NMR sensing device toward a substance associated with the location within the wellbore, the second RF signal at an RF signal energy level that corresponds to the set of calibration data;
collecting, by the NMR sensing device, data associated with the substance; and
identifying a distance that separates the NMR sensing device from the substance based on a value of response magnitude received at the NMR sensing device that corresponds to the set of calibration data associated with the second temperature.

8. The method of claim 1, further comprising:
measuring a transverse relaxation (T2) time; and
identifying the maximum observed transition magnitude based on the measured T2 time.

9. The method of claim 1, wherein the first RF signal is transmitted at a first RF signal energy level and the second RF signal is transmitted at a second RF signal energy level.

10. The method of claim 9, wherein the first RF signal energy level and the second RF signal energy level are the same.

11. A non-transitory computer-readable storage medium having embodied thereon instructions executable by one or more processors to implement a method comprising:
obtaining, from a nuclear magnetic resonance (NMR) sensing device placed in a calibration chamber, a plurality of measurements associated with a calibration medium;
identifying a first radio frequency (RF) signal that stimulates a maximum observed transition magnitude when the first RF signal is transmitted into the calibration medium and when the calibration chamber is at a first temperature;
identifying a second RF signal that stimulates the maximum observed transition magnitude when the second RF signal is transmitted and when the calibration chamber is at a second temperature; and
associating the first temperature with the first RF signal and the second temperature with the second RF signal in a set of calibration data that cross-references:
the first temperature with the first RF signal, and
the second temperature with the second RF signal, wherein the calibration data is accessed when data collected at a wellbore is evaluated to identify a characteristic of the wellbore.

12. The non-transitory computer-readable storage medium of claim 11, wherein one or more operating characteristics associated with the NMR sensing device include:
a temperature of a plurality of temperatures,
one or more distances between the NMR sensing device and respective portions of the calibration medium,
one or more RF signal frequencies transmitted into the calibration medium,
a longitudinal relaxation time, and
a transition magnitude that is associated with a respective magnetic field tipping angle of a plurality of magnetic field tipping angles.

13. The non-transitory computer-readable storage medium of claim 11, wherein the one or more processors also execute the instructions to:
identify that a particular temperature of a location within a wellbore where the NMR sensing device is deployed matches the second temperature;
select the second RF signal for the location within the wellbore based on calibration data that cross-references the second temperature with the second RF signal;
emit, from the NMR sensing device into the location within the wellbore, the second RF signal at an RF signal energy;
collect, by the NMR sensing device, data associated with a substance at the location within the wellbore; and
identify a composition of the substance based on the data associated with the calibration medium.

14. The non-transitory computer-readable storage medium of claim 11, wherein the one or more processors also execute the instructions to:
identify that a wellbore temperature at a location where the NMR sensing device is deployed is between the first temperature and the second temperature;
identify a temperature difference between the first temperature and the wellbore temperature;
estimate an RF frequency of a third RF signal to associate with the wellbore temperature based on at least the temperature difference;
emit the third RF signal toward the wellbore at the RF frequency;
collect, by the NMR sensing device, data associated with a substance located within the wellbore based on the third RF signal emitted at the RF frequency; and
identify a composition of the substance based on the collected data.

15. The non-transitory computer-readable storage medium of claim 11, wherein the plurality of measurements includes data collected at one or more additional temperatures in the calibration chamber.

16. The non-transitory computer-readable storage medium of claim 11, wherein the one or more processors also execute the instructions to:
generate a series of curves from data associated with the plurality of measurements, wherein each respective curve from the series of curves:
is associated with a respective temperature, and
cross-references a respective set of temperature related response measurement values with a plurality of distances between the NMR sensing device and respective portions of the calibration medium.

17. The non-transitory computer-readable storage medium of claim 11, wherein the one or more processors also execute the instructions to:
identify that a particular temperature at a location within a wellbore where the NMR sensing device is deployed matches the second temperature;
identify that the second RF signal should be emitted based on the particular temperature matching the second temperature;

emit, from the NMR sensing device toward a substance associated with the location within the wellbore, the second RF signal at an RF signal energy level that corresponds to the set of calibration data;

collect, by the NMR sensing device, data associated with the substance; and identify a distance that separates the NMR sensing device from the substance based on a value of response magnitude received at the NMR sensing device that corresponds to the set of calibration data associated with the second temperature.

18. The non-transitory computer-readable storage medium of claim 11, wherein the one or more processors also execute the instructions to:

measure a transverse relaxation (T2) time; and identify the maximum observed transition magnitude based on the measured T2 time.

19. An apparatus comprising:

a temperature-controlled isolation chamber;

a nuclear magnetic resonance (NMR) sensing device that is placed in the temperature-controlled isolation chamber, wherein the NMR sensing device obtains a plurality of measurements associated with a calibration medium;

a memory; and one or more processors that execute instructions out of the memory to:

identify a first radio frequency (RF) signal that stimulates a maximum observed transition magnitude when the first RF signal is transmitted into the calibration medium and when the calibration chamber is at a first temperature, identify a second RF signal that stimulates the maximum observed transition magnitude when the second RF signal is transmitted and when the calibration chamber is at a second temperature, and associate the first temperature with the first RF signal and the second temperature with the second RF signal in a set of calibration data that cross-references: the first temperature with the first RF signal, and the second temperature with the second RF signal, wherein the calibration data is accessed when data collected at a wellbore is evaluated to identify a characteristic of the wellbore.

20. The apparatus of claim 19, further comprising:

one or more elements that isolate an internal portion of the temperature-controlled isolation chamber from an environment outside of the temperature-controlled isolation chamber, wherein the one or more elements include at least one of:

a magnetic shielding material;

a RF shielding material; or a vibration isolation system.

* * * * *